United States Patent
Park et al.

(10) Patent No.: US 11,765,918 B2
(45) Date of Patent: Sep. 19, 2023

(54) LIGHT EMITTING DEVICE COMPRISING GRADIENT ELECTRON AUXILIARY LAYER AND DISPLAY DEVICE INCLUDING THE SAME

(71) Applicant: SAMSUNG ELECTRONICS CO., LTD., Suwon-si (KR)

(72) Inventors: Kun Su Park, Seongnam-si (KR); Chan Su Kim, Seoul (KR); Kwanghee Kim, Seoul (KR); Eun Joo Jang, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 123 days.

(21) Appl. No.: 17/007,021

(22) Filed: Aug. 31, 2020

(65) Prior Publication Data

US 2021/0066634 A1 Mar. 4, 2021

(30) Foreign Application Priority Data

Aug. 30, 2019 (KR) .................. 10-2019-0107636

(51) Int. Cl.
*H10K 50/115* (2023.01)
*H10K 50/16* (2023.01)
(Continued)

(52) U.S. Cl.
CPC .......... *H10K 50/115* (2023.02); *H10K 50/16* (2023.02); *H10K 50/171* (2023.02); *H10K 2102/00* (2023.02)

(58) Field of Classification Search
None
See application file for complete search history.

(56) References Cited

U.S. PATENT DOCUMENTS

| 8,410,470 B2 | 4/2013 | Omata et al. |
| 9,054,330 B2 | 6/2015 | Qian et al. |
| (Continued) | | |

FOREIGN PATENT DOCUMENTS

| CN | 102115910 B | 8/2012 |
| CN | 109728179 A | 5/2019 |
| (Continued) | | |

OTHER PUBLICATIONS

Extended European Search Report dated Jan. 12, 2021, of the corresponding European Patent Application No. 20193558.2.
(Continued)

*Primary Examiner* — Daniel Whalen
(74) *Attorney, Agent, or Firm* — CANTOR COLBURN LLP

(57) ABSTRACT

A light emitting device includes an emission layer including a plurality of quantum dots, and an electron auxiliary layer disposed on the emission layer, the electron auxiliary layer to transport electrons to the emission layer, wherein the electron auxiliary layer includes a plurality of metal oxide nanoparticles, wherein the metal oxide nanoparticles include zinc and a dopant metal, wherein the dopant metal includes Mg, Mn, Ni, Sn, Al, Y, Ga, Zr, Ni, Li, Co, or a combination thereof, wherein the dopant metal in at least one of the metal oxide nanoparticles is included in the metal oxide nanoparticle to have a concentration gradient of the dopant metal.

24 Claims, 8 Drawing Sheets

(51) Int. Cl.
*H10K 50/17* (2023.01)
*H10K 102/00* (2023.01)

(56) References Cited

U.S. PATENT DOCUMENTS

| | | | |
|---|---|---|---|
| 9,373,823 | B2 | 6/2016 | Chiba et al. |
| 2015/0047417 | A1 | 2/2015 | Park et al. |
| 2019/0081262 | A1* | 3/2019 | Kim .................... H01L 27/3262 |
| 2019/0157596 | A1* | 5/2019 | Kim .................... H01L 51/5004 |
| 2019/0296257 | A1* | 9/2019 | Palles-Dimmock ........................ H01L 51/5056 |
| 2020/0067005 | A1* | 2/2020 | Park ...................... H01L 51/502 |
| 2021/0043864 | A1 | 2/2021 | Li |

FOREIGN PATENT DOCUMENTS

| | | |
|---|---|---|
| KR | 20150019310 A | 2/2015 |
| KR | 101658691 B1 | 9/2016 |
| KR | 2019005//33 A | 5/2019 |

OTHER PUBLICATIONS

Jong-Hoon Kim et al., "Performance Improvement of Quantum Dot-Light-Emitting Diodes Enabled by an Alloyed ZnMgO Nanoparticle Electron Transport Layer," Chem. Mater., Dec. 9, 2014, pp. 197-204, vol. 27.

Swapnil Doke et al., "Sustained multiferroicity in liquid crystal induced by core/shell quantum dots", Journal of Molecular Liquids, Apr. 24, 2019, vol. 288.

* cited by examiner

LIGHT EMITTING DEVICE COMPRISING GRADIENT ELECTRON AUXILIARY LAYER AND DISPLAY DEVICE INCLUDING THE SAME

CROSS-REFERENCE TO RELATED APPLICATION

This application claims priority to and the benefit of Korean Patent Application No. 10-2019-0107636 filed in the Korean Intellectual Property Office on Aug. 30, 2019, and all the benefits accruing therefrom under 35 U.S.C. § 119, the content of which in its entirety is herein incorporated by reference.

BACKGROUND

1. Field

A light emitting device and a display device are disclosed.

2. Description of the Related Art

Physical characteristics (e.g., bandgap energies, melting points, etc.) of nanoparticles that are intrinsic characteristics may be controlled by changing the particle sizes of the nanoparticles, unlike bulk materials. For example, semiconductor nanocrystals also known as quantum dots may be supplied with photoenergy or electrical energy and may emit light in a wavelength corresponding to sizes of the quantum dots. Accordingly, the quantum dots may be used as a light emitting element emitting light of a particular wavelength.

SUMMARY

Quantum dots may be used as a light emitting device. However, a new method of improving a performance of a light emitting device including quantum dots is desired.

An embodiment provides a light emitting device capable of realizing improved performance.

An embodiment provides a display device including the light emitting device.

According to an embodiment, a light emitting device includes, an emission layer including a plurality of quantum dots, and an electron auxiliary layer disposed on the emission layer, the electron auxiliary layer to transport and/or inject electrons to the emission layer, wherein the electron auxiliary layer includes a plurality of metal oxide nanoparticles, wherein the metal oxide nanoparticle includes zinc and a dopant metal, wherein the dopant metal includes Mg, Mn, Ni, Sn, Al, Y, Ga, Zr, Li, Co, or a combination thereof, and wherein in at least one of the metal oxide nanoparticles, the dopant metal is included (e.g., distributed) to have a concentration gradient in the metal oxide nanoparticle.

In an embodiment, a concentration of the dopant metal in at least one of the metal oxide nanoparticles may increase in a direction from an inner portion to an outer portion of the nanoparticle In another embodiment, a concentration of the dopant metal may increase in a direction from the outer portion to the inner portion of the nanoparticle.

In an embodiment, a molar amount of the dopant metal in the inner portion may be different (greater or less) from (than) that of the outer portion.

The dopant metal may be predominantly present (e.g., distributed) in an inner portion of the metal oxide nanoparticles. For example, in at least one of the metal oxide nanoparticles, a concentration (or molar amount, hereinafter a concentration) of the dopant metal may increase in a direction from the outer portion to the inner portion of the nanoparticle.

The dopant metal may be predominantly present (e.g., distributed) in an outer portion of the metal oxide nanoparticles. For example, in at least one of the metal oxide nanoparticles a concentration of the dopant metal may increase in a direction from an inner portion to an outer portion of the nanoparticle.

The metal oxide nanoparticles may include a first layer and a second layer disposed on the first layer.

The first layer may have a concentration, e.g., molar amount, of the dopant metal that is greater than that of the second layer. The second layer may not include the dopant metal. The second layer may have a concentration, e.g., molar amount, of the dopant metal that is greater than that of the first layer. The first layer may not include the dopant metal.

The second layer may be an outermost layer of the metal oxide nanoparticle.

The plurality of the quantum dots may not include cadmium, lead, or a combination thereof.

The plurality of quantum dot may include a Group II-VI compound, a Group III-V compound, a Group IV-VI compound, a Group IV element or compound, a Group I-III-VI compound, a Group I-III-VI compound, a Group I-II-IV-VI compound, or a combination thereof.

The dopant metal may include magnesium, aluminum, lithium, or a combination thereof.

The dopant metal may not include sodium.

A mole ratio of the dopant metal with respect to the zinc in the metal oxide nanoparticle may be greater than or equal to about 0.005:1

A mole ratio of the dopant metal with respect to the zinc in the metal oxide nanoparticle may be greater than or equal to about 0.01:1.

A mole ratio of the dopant metal with respect to the zinc in the metal oxide nanoparticle may be greater than or equal to about 0.05:1.

A mole ratio of the dopant metal with respect to the zinc in the metal oxide nanoparticle may be greater than or equal to about 0.1:1.

A mole ratio of the dopant metal with respect to the zinc in the metal oxide nanoparticle may be less than or equal to about 0.5:1.

A mole ratio of the dopant metal with respect to the zinc in the metal oxide nanoparticle may be less than or equal to about 0.4:1.

A mole ratio of the dopant metal with respect to the zinc in the metal oxide nanoparticle may be less than or equal to about 0.3:1.

A mole ratio of the dopant metal with respect to the zinc in the metal oxide nanoparticle may be less than or equal to about 0.25:1.

The metal oxide nanoparticles may have a first ultraviolet (UV) absorption peak wavelength of less than or equal to about 350 nanometers (nm), less than or equal to about 345 nm, or less than or equal to about 340 nm.

The metal oxide nanoparticles may have a first UV absorption peak wavelength of greater than or equal to about 320 nm, greater than or equal to about 325 nm, or greater than or equal to about 330 nm.

The metal oxide nanoparticles may have a trap emission peak having a center wavelength of greater than or equal to about 500 nm, of greater than or equal to about 510 nm, (e.g., in a photoluminescent spectrum at room temperature or at 77 K). The center wavelength of the trap emission peak may be less than or equal to about 600 nm, or less than or equal to about 560 nm.

The metal oxide nanoparticles may be configured to exhibit a band-edge emission peak having a center wavelength of about less than or equal to about 400 nm or less than or equal to about 390 nm in a photoluminescent spectrum (e.g., at 77 K).

The center wavelength of the band-edge emission peak may be greater than or equal to about 200 nm, greater than or equal to about 300 nm, or greater than or equal to about 350 nm in a photoluminescent spectrum (e.g., at 77 K).

A ratio of an intensity of the trap emission peak with respect to an intensity of the band-edge emission peak may be greater than or equal to about 2.9:1 (for example, in a low temperature photoluminescent (PL) spectrum of about 77 K). The ratio of an intensity of the trap emission peak with respect to an intensity of the band-edge emission peak may be greater than or equal to about 5:1. A ratio of an intensity of the trap emission peak with respect to an intensity of the band-edge emission peak may be greater than or equal to about 7:1. A ratio of an intensity of the trap emission peak with respect to an intensity of the band-edge emission peak may be greater than or equal to about 9:1.

The metal oxide nanoparticles may have an organic content, e.g., amount of organics, of greater than or equal to about 20 weight percent (wt %) as determined by a thermogravimetric analysis.

The metal oxide nanoparticles may have an amount of organics of greater than or equal to about 24 wt % as determined by a thermogravimetric analysis.

A resistivity of the electron auxiliary layer may be greater than or equal to about $1\times10^4$ ohm·cm, greater than or equal to about $1\times10^5$ ohm·cm, greater than or equal to about $3\times10^8$ ohm·cm, or greater than or equal to about $3.5\times10^8$ ohm·cm.

A contact resistance of the electron auxiliary layer may be less than or equal to about $5\times10^{11}$ ohm·cm$^2$, less than or equal to about $4\times10^{11}$ ohm·cm$^2$, less than or equal to about $3\times10^{11}$ ohm·cm$^2$, less than or equal to about $2\times10^{11}$ ohm·cm$^2$, less than or equal to about $1.5\times10^{11}$ ohm·cm$^2$, less than or equal to about $1.4\times10^{11}$ ohm·cm$^2$, less than or equal to about $1\times10^{11}$ ohm·cm$^2$, or less than or equal to about $1\times10^{10}$ ohm·cm$^2$.

The metal oxide nanoparticles may include a core including a first metal oxide and a shell disposed on the core, the shell including a second metal oxide, and the second metal oxide may have a different composition from a composition of the first metal oxide.

The first metal oxide may include zinc and optionally a first metal.

The second metal oxide may include zinc and optionally a second metal.

The first metal may include magnesium, aluminum, lithium, yttrium, gallium, zirconium, nickel, cobalt, or a combination thereof. The second metal may include magnesium, aluminum, lithium, yttrium, gallium, zirconium, nickel, cobalt, or a combination thereof.

A bandgap energy of the first metal oxide may be greater than or equal to a bandgap energy of the second metal oxide.

The first metal oxide may include the first metal and a mole ratio of the first metal with respect to zinc may be less than about 1:1, or less than or equal to about 0.5:1. The first metal oxide may include magnesium and a mole ratio of the magnesium with respect to zinc may be less than about 1:1, or less than or equal to about 0.5:1, or less than or equal to about 0.3:1.

The second metal oxide may include a compound represented by Chemical Formula 2:

$$Zn_{1-y}M_yO \qquad \text{Chemical Formula 2}$$

wherein, M is Mg, Mn, Al, Li, Y, Ga, Zr, Ni, Co or a combination thereof and $0 \leq y < 1$, or $0 \leq y \leq 0.5$.

The first (or second) metal oxide may include a zinc magnesium oxide, and the second (or first) metal oxide may include a zinc oxide. The second (or first) metal oxide may not include magnesium, manganese, aluminum, lithium, yttrium, gallium, zirconium, nickel, cobalt, or a combination thereof.

An average size of the metal oxide nanoparticles may be greater than or equal to about 2 nm or greater than or equal to about 3 nm.

An average size of the metal oxide nanoparticles may be less than or equal to about 10 nm.

An average size of the metal oxide nanoparticles may be greater than or equal to about 3 nm and less than or equal to about 6 nm.

The light emitting device may emit blue light and may have a maximum external quantum efficiency (max EQE) of greater than or equal to about 14%.

The light emitting device (e.g., may emit blue light and) may have a maximum brightness of greater than or equal to about 35,000 candelas per square meter.

The light emitting device may emit blue light and may have a T50 of greater than about 50 hours.

The metal oxide nanoparticle may include a core and a shell disposed on the core, and greater than or equal to about 70 mole percent of the dopant metal may be present in the core, based on a total number of moles of the dopant metal present in the metal oxide nanoparticle.

The metal oxide nanoparticle may include a core and a shell disposed on the core, and greater than or equal to about 70 mole percent of the dopant metal may be present in the shell, based on a total number of moles of the dopant metal present in the metal oxide nanoparticle.

According to an embodiment, a method of preparing zinc oxide nanoparticles includes providing a first organic solution including a first zinc precursor, a first organic solvent, and optionally a first dopant precursor; adding a first hydroxide solution to the first organic solution to form a first mixture; stirring the first mixture to form a precipitate; separating the precipitate to provide a separated precipitate; dispersing the separated precipitate in dispersing solvent to form a dispersion; mixing the dispersion with a second organic solution including a second zinc precursor, a second organic solvent, and optionally a second dopant precursor to form a second mixture; adding a second hydroxide solution to the second mixture to form a third mixture; and stirring third mixture to prepare the zinc oxide nanoparticles, wherein the first organic solution includes the first dopant precursor, the second organic solution includes the second dopant precursor, or a combination thereof.

In the device (e.g., the electroluminescent device) of an embodiment, an electron mobility in the electron auxiliary layer may be controlled appropriately and an electrical resistance between the emission layer and the electron auxiliary layer may be decreased, whereby injection/transport of the electrons may be efficiently carried out and a hole movement (or hole extraction) toward the cathode may be effectively prevented. Accordingly, the device of an embodiment may exhibit an increased luminance efficiency and improved lifetime properties. The stacked structure included in the device of an embodiment may be also used in a light emitting diode, a sensor, a laser, a solar cell device, or any suitable semiconductor device.

BRIEF DESCRIPTION OF THE DRAWINGS

The above and other advantages and features of this disclosure will become more apparent by describing in further detail exemplary embodiments thereof with reference to the accompanying drawings, in which.

DETAILED DESCRIPTION

Figure 1A:
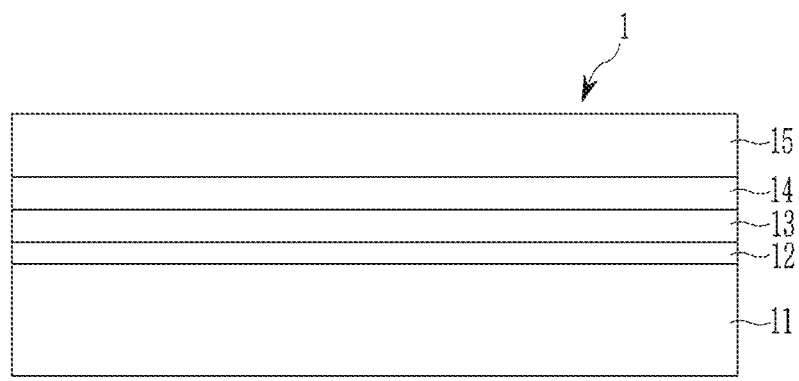
FIG. 1A is a schematic cross-sectional view of a light emitting device according to an embodiment.

Hereinafter, example embodiments of the present disclosure will be described in detail so that a person skilled in the art would understand the same. This disclosure may, however, be embodied in many different forms and is not construed as limited to the example embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer, or section from another element, component, region, layer, or section. Thus, "a first element," "component," "region," "layer," or "section" discussed below could be termed a second element, component, region, layer, or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

"About" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

As used herein, the expression "not including cadmium (or other harmful heavy metal)" may refer to the case in which a concentration of cadmium (or a harmful heavy metal) may be less than or equal to about 100 parts per million by weight (ppmw), less than or equal to about 50 ppmw, less than or equal to about 10 ppmw, less than or equal to about 1 ppmw, less than or equal to about 0.1 ppmw, less than or equal to about 0.01 ppmw, or about zero. In an embodiment, substantially no amount of cadmium (or other heavy metal) may be present or, if present, an amount of cadmium (or other heavy metal) may be less than or equal to a detection limit or as an impurity level of a given analysis tool (e.g., an inductively coupled plasma atomic emission spectroscopy).

As used herein, the term a work function, a conduction band-edge (CB), a valence band-edge (VB), a highest occupied molecular orbital ("HOMO") or a lowest unoccupied molecular orbital ("LUMO") energy level are expressed as an absolute value from a vacuum. if a work function, a CB, a VB, a HOMO, or a LUMO energy level is said to be 'deep,' 'high' or 'large', the work function, the CB/VB energy level, or the HOMO/LUMO energy level has a large absolute value relative to '0 electronvolts (eV),' i.e., the energy level of a vacuum. In contrast, if a work function, a CB, a VB, a HOMO, or a LUMO energy level is said to be 'shallow,' 'low,' or 'small', the work function, the CB/VB energy level, or the HOMO/LUMO energy level has a small absolute value from '0 eV,' i.e., the energy level of a vacuum.

A LUMO/HOMO energy level, a CB/VB energy level, a work-function, or a combination thereof may be measured by using an appropriate method, which is not particularly limited. In an embodiment, a LUMO/HOMO energy level, a CB/VB energy level, a work-function, or a combination thereof of a given material may be measured by a Cyclic Volumetry (CV) method, a spectroscopic analysis (e.g., an Ultraviolet Photoelectron Spectroscopy (UPS) method, an UV-Vis spectroscopy, or a combination thereof), a Photoelectron spectroscopy in air (e.g., using AC-3), a Kelvin Probe force microscopy measurement, or a combination thereof.

As used herein, the term "Group" may refer to a group of Periodic Table.

As used herein, "Group I" may refer to Group IA and Group IB, and examples may include Li, Na, K, Rb, and Cs, but are not limited thereto.

As used herein, "Group II" may refer to Group IIA and Group IIB, and examples of Group II metal may be Cd, Zn, Hg, and Mg, but are not limited thereto.

As used herein, "Group III" may refer to Group IIIA and Group IIIB, and examples of Group III metal may be Al, In, Ga, and Tl, but are not limited thereto.

As used herein, "Group IV" may refer to Group IVA and Group IVB, and examples of a Group IV metal may be Si, Ge, and Sn, but are not limited thereto. As used herein, the term "metal" may include a semi-metal such as Si.

As used herein, "Group V" may refer to Group VA, and examples may include nitrogen, phosphorus, arsenic, antimony, and bismuth, but are not limited thereto.

As used herein, "Group VI" may refer to Group VIA, and examples may include sulfur, selenium, and tellurium, but are not limited thereto.

As used herein, when a definition is not otherwise provided, "substituted" may refer to replacement of hydrogen of a compound, a group, or a moiety by a C1 to C30 alkyl group, a C2 to C30 alkenyl group, a C2 to C30 alkynyl group, a C2 to C30 epoxy group, a C2 to C30 alkyl ester group, a C3 to C30 alkenyl ester group (e.g., an acrylate group, methacrylate group), a C6 to C30 aryl group, a C7 to C30 alkylaryl group, a 01 to C30 alkoxy group, a C1 to C30 heteroalkyl group, C3 to C40 heteroaryl group, a C3 to C30 heteroalkylaryl group, a C3 to C30 cycloalkyl group, a C3 to C15 cycloalkenyl group, a C6 to C30 cycloalkynyl group, a C2 to C30 heterocycloalkyl group, a halogen (—F, —Cl, —Br, or —I), a hydroxy group (—OH), a nitro group (—NO$_2$), a cyano group (—CN), an amino group (—NRR' wherein R and R' are independently hydrogen or a 01 to C6 alkyl group), an azido group (—N$_3$), an amidino group (—C(=NH)NH$_2$), a hydrazino group (—NHNH2), a hydrazono group (=N(NH$_2$)), an aldehyde group (—C(=O)H), a carbamoyl group (—C(O)NH$_2$), a thiol group (—SH), an ester group (—C(=O)OR, wherein R is a C1 to C6 alkyl group or a C6 to C12 aryl group), a carboxyl group (—COOH) or a salt thereof (—C(=O)OM, wherein M is an organic or inorganic cation), a sulfonic acid group (—SO$_3$H) or a salt thereof (—SO$_3$M, wherein M is an organic or inorganic cation), a phosphoric acid group (—PO$_3$H$_2$) or a salt thereof (—PO$_3$MH or —PO$_3$M$_2$, wherein M is an organic or inorganic cation), or a combination thereof.

The wording "hydrocarbon" group may refer to a group including carbon and hydrogen (e.g., an aliphatic such as an alkyl, an alkenyl, an alkynyl, or an aromatic such as an aryl group). The hydrocarbon group may be a group having a valence of at least one that is formed by elimination of at least one hydrogen atom therefrom (e.g., an alkane, an alkene, an alkyne, or an arene group). At least one methylene in the aliphatic group may be replaced with an oxide moiety, a carbonyl moiety, an ester moiety, —NH—, or a combination thereof. Unless indicated otherwise, an aliphatic group (e.g., alkyl, alkenyl, alkynyl, or aryl) may have any suitable number of carbon atoms, e.g., from 1 to 60 carbon atoms, or 2 to 32 carbon atoms, or 3 to 24 carbon atoms, or 4 to 12 carbon atoms.

As used herein, when a definition is not otherwise provided, "alkyl" may refer to a linear or branched saturated monovalent hydrocarbon group (methyl, ethyl, hexyl, etc.).

As used herein, when a definition is not otherwise provided, "alkenyl" may refer to a linear or branched monovalent hydrocarbon group having one or more carbon-carbon double bond.

As used herein, when a definition is not otherwise provided, "alkynyl" may refer to a linear or branched monovalent hydrocarbon group having one or more carbon-carbon triple bond.

As used herein, when a definition is not otherwise provided, "aryl" may refer to a group formed by elimination of at least one hydrogen atom from an aromatic hydrocarbon (e.g., a phenyl or naphthyl group).

As used herein, "hetero" may refer to one including one or more (e.g., 1 to 3) heteroatom of N, O, S, Si, P, or a combination thereof.

As used herein, when a definition is not otherwise provided, "alkoxy" may refer to an alkyl group that is linked via an oxygen (i.e., alkyl-O—), for example methoxy, ethoxy, and sec-butyloxy groups.

As used herein, when a definition is not otherwise provided, an "amine" group has the general formula —NRR, wherein each R is independently hydrogen, a C1-C12 alkyl group, a C7-C20 alkylarylene group, a C7-C20 arylalkylene group, or a C6-C18 aryl group.

Hereinafter, a light emitting device according to an embodiment is described with reference to drawings.

FIG. 1A is a schematic cross-sectional view of a light emitting device according to an embodiment. Referring to FIG. 1A, a light emitting device 1 according to an embodiment includes an emission layer 13 including a plurality of quantum dots; and an electron auxiliary layer 14 transporting and injecting electrons to the emission layer 13.

The emission layer 13 includes (e.g., a plurality of) quantum dots. In an embodiment, the quantum dots may not include cadmium, lead, mercury, or a combination thereof. The quantum dots may have a core-shell structure including a core including a first semiconductor nanocrystal and a shell disposed on the core and including a second semiconductor nanocrystal. The second semiconductor nanocrystal may have a composition that is different from the first semiconductor nanocrystal.

The quantum dot (e.g., the first semiconductor nanocrystal and the second semiconductor nanocrystal in the core-shell structure) may include a Group II-VI compound, a Group III-V compound, a Group IV-VI compound, a Group IV element or compound, a Group compound, a Group compound, a Group I-II-IV-VI compound, or a combination thereof. The emission layer may not include a harmful heavy metal such as cadmium, lead, mercury, or a combination thereof.

The Group II-VI compound may be a binary element compound such as CdSe, CdTe, ZnS, ZnSe, ZnTe, ZnO, HgS, HgSe, HgTe, MgSe, MgS, or a combination thereof; a ternary element compound such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, or a combination thereof; a quaternary element compound such as ZnSeSTe, HgZnTeS, CdZnSeS, CdZnSeTe, CdZnSTe, CdHgSeS, CdHgSeTe, CdHgSTe, HgZnSeS, HgZnSeTe, HgZnSTe, or a combination thereof; or a combination thereof. The Group II-VI compound may further include a Group III metal. The Group III-V compound may be a binary element compound such as GaN, GaP, GaAs, GaSb, AlN, AlP, AlAs, AlSb, InN, InP, InAs, InSb, or a combination thereof; a ternary element compound such as GaNP, GaNAs, GaNSb, GaPAs, GaPSb, AlNP, AlNAs, AlNSb, AlPAs, AlPSb, InNP, InNAs, InNSb, InPAs, InPSb, or a combination thereof; a quaternary element compound such as GaAlNP, GaAlNAs, GaAlNSb, GaAlPAs, GaAlPSb, GaInNP, GaInNAs, GaInNSb, GaIn-PAs, GaInPSb, InAlNP, InAlNAs, InAlNSb, InAlPAs, InAlPSb, or a combination thereof; or a combination thereof. The Group III-V compound may further include a Group II metal (e.g., InZnP). The Group IV-VI compound may be a binary element compound such as SnS, SnSe, SnTe, PbS, PbSe, PbTe, or a combination thereof; a ternary element compound such as SnSeS, SnSeTe, SnSTe, PbSeS, PbSeTe, PbSTe, SnPbS, SnPbSe, SnPbTe, or a combination thereof; a quaternary element compound such as SnPbSSe, SnPbSeTe, SnPbSTe, or a combination thereof; or a combination thereof. Examples of the Group compound may include $CuInSe_2$, $CuInS_2$, CuInGaSe, and CuInGaS, but are not limited thereto. Examples of the Group I-II-IV-VI compound may include CuZnSnSe and CuZnSnS, but are not limited thereto. The Group IV element or compound may be a single substance such as Si, Ge, or a combination thereof; a binary element compound such as SiC, SiGe, or a combination thereof; or a combination thereof.

In an embodiment, the quantum dot or the core (e.g., the first semiconductor nanocrystal) may include a metal including indium, zinc, or a combination thereof and a non-metal including phosphorus, selenium, tellurium, sulfur, or a combination thereof. The core may be an emission center. In an embodiment, the second semiconductor nanocrystal may include a metal including indium, zinc, or a combination thereof and a non-metal including phosphorus, selenium, tellurium, sulfur, or a combination thereof. In an embodiment, the first semiconductor nanocrystal may include InP, InZnP, ZnSe, ZnSeS, ZnSeTe, or a combination thereof. In an embodiment, the second semiconductor nanocrystal may include ZnSe, ZnSeS, ZnS, ZnTeSe, or a combination thereof.

In an embodiment, the quantum dots may emit blue light or green light, and may include a core including ZnSeTe, ZnSe, or a combination thereof and a shell including zinc, selenium, and sulfur (e.g., ZnSeS). In the shell, an amount of the sulfur may vary in a radial direction (e.g., increase or decrease from the core and a surface of the quantum dot). In an embodiment, the shell may include zinc, sulfur, and optionally selenium in its outermost layer. In an embodiment, the quantum dot may emit red light or green light and may include a core including InP, InZnP, or a combination thereof and the shell may include a Group II metal including zinc and a non-metal including sulfur, selenium, or a combination thereof.

In an embodiment, the quantum dots may have a core shell structure and at an interface between the core and the shell an alloyed layer may be present or may not present. The alloyed layer may include a homogenous alloy. The alloyed layer may include a gradient alloy. In a gradient alloy, a concentration of an element present in the shell may have a gradient varying in a radial direction (e.g., increasing or decreasing toward the core).

In an embodiment, the shell may have a radially varying composition. In an embodiment, the shell may be a multi-layered shell having at least two layers. In the multi-layered shell, adjacent two layers may have different compositions with each other. In the multi-layered shell, at least one layer may have each independently a semiconductor nanocrystal of a single composition. In the multi-layered shell, at least one layer may have each independently an alloyed semiconductor nanocrystal. In the multi-layered shell, at least one layer may exhibit each independently a concentration gradient varying in a radial direction in terms of a composition of the semiconductor nanocrystal.

In the quantum dot of the core-shell structure, the shell material and the core material may have different bandgap energy from each other. For example, the bandgap energy of the shell material may be greater than that of the core material but is not limited thereto. According to an embodiment, the bandgap energy of the shell material may be less than that of the core material. In the multi-layered shell, a bandgap energy of an outermost layer may be greater than the bandgap energy of the core and the inner layers (i.e., the layer nearer to the core). In the multi-layered shell, a bandgap energy of each layer may be selected appropriately for an efficient quantum confinement effect.

The quantum dots may include an organic ligand and optionally a halogen (e.g., chlorine) moiety (for example, bound to or coordinating on a surface).

The organic ligand may include RCOOH, $RNH_2$, $R_2NH$, $R_3N$, RSH, $R_3PO$, $R_3P$, ROH, RCOOR, $RPO(OH)_2$, RHPOOH, $R_2POOH$, or a combination thereof, wherein each R is independently a C3 to C40, or C5 to C40 substituted or unsubstituted aliphatic hydrocarbon group (e.g., alkyl, alkenyl, or alkynyl), a C6 to C40 substituted or unsubstituted aromatic hydrocarbon group (e.g., an aryl group), or a combination thereof.

Examples of the organic ligand may be a thiol compound such as methane thiol, ethane thiol, propane thiol, butane thiol, pentane thiol, hexane thiol, octane thiol, dodecane thiol, hexadecane thiol, octadecane thiol, or benzyl thiol; an amine compound such as methane amine, ethane amine, propane amine, butane amine, pentyl amine, hexyl amine, octyl amine, nonyl amine, decyl amine, dodecyl amine, hexadecyl amine, octadecyl amine, dimethyl amine, diethyl amine, dipropyl amine, tributyl amine, or trioctyl amine; a carboxylic acid compound such as methanoic acid, ethanoic acid, propanoic acid, butanoic acid, pentanoic acid, hexanoic acid, heptanoic acid, octanoic acid, dodecanoic acid, hexadecanoic acid, octadecanoic acid, oleic acid, or benzoic acid; a phosphine compound such as methyl phosphine, ethyl phosphine, propyl phosphine, butyl phosphine, pentyl phosphine, octyl phosphine, dioctyl phosphine, tributyl phosphine, diphenyl phosphine, triphenyl phosphine, or trioctyl phosphine; a phosphine oxide compound such as methyl phosphine oxide, ethyl phosphine oxide, propyl phosphine oxide, butyl phosphine oxide pentyl phosphineoxide, tributyl phosphine oxide, octyl phosphine oxide, dioctyl phosphine oxide, diphenyl phosphine oxide, triphenyl phosphine oxide, or trioctyl phosphine oxide; a C5 to C20 alkyl phosphinic acid such as hexyl phosphinic acid, octyl phosphinic acid, dodecane phosphinic acid, tetradecane phosphinic acid, hexadecane phosphinic acid, octadecane phosphinic acid; an alkylphosphonic acid such as a C5 to C20 alkylphosphonic acid, for example, hexyl phosphonic acid, octyl phosphonic acid, dodecane phosphonic acid, tetradecane phosphonic acid, hexadecane phosphonic acid, or octadecane phosphonic acid; and the like, but are not limited thereto. The quantum dots may include a hydrophobic organic ligand that is the same, or a mixture of at least two different hydrophobic organic ligands. The hydrophobic organic ligand may not include a photopolymerizable moiety (e.g., an acrylate group, a methacrylate group, etc.).

The halogen moiety may include chlorine, bromine, iodine, or a combination thereof.

In an embodiment, the quantum dot may include a first organic ligand and a halogen for example on a surface thereof. The first organic ligand may include a C6 to C40 aliphatic carboxylic acid compound (e.g., a myristic acid, oleic acid, stearic acid, or the like). The carboxylic acid compound may include a compound represented by RCOOH (wherein R is a C12 or greater alkyl group or a C12 or greater alkenyl group).

In an embodiment, the quantum dot may include a halogen moiety (or halogen) and an amount of the halogen (moiety) may be, per 1 mg of the quantum dot, greater than or equal to about 1 microgram (μg), for example, greater than or equal to about 2 μg, greater than or equal to about 3 μg, greater than or equal to about 4 μg, greater than or equal to about 5 μg, greater than or equal to about 6 μg, or greater than or equal to about 7 μg and less than or equal to about 12.5 μg, and, for example, less than or equal to about 12.4 μg, less than or equal to about 12.3 μg, less than or equal to about 12.2 μg, less than or equal to about 12.1 μg, less than or equal to about 12 μg, less than or equal to about 11.9 μg, or less than or equal to about 11.8 μg. A mole ratio of the halogen (e.g., chlorine) with respect to the organic ligand (e.g., a fatty acid such as oleic acid) may be less than about 2.2:1, for example, less than or equal to about 2:1, less than or equal to about 1.9:1, less than or equal to about 1.8:1, less than or equal to about 1.7:1, or less than or equal to about 1.6:1. The mole ratio of the halogen with respect to the organic ligand may be greater than or equal to about 0.5:1, for example, greater than or equal to about 0.6:1, greater than or equal to about 0.7:1, greater than or equal to about 0.8:1, or greater than or equal to about 0.9:1.

The quantum dots further including the halogen moiety may be obtained by contacting the quantum dots in an organic dispersion with a halogen or an alcohol solution containing the halogen at an elevated temperature of for example greater than or equal to about 30° C., greater than or equal to about 35° C., greater than or equal to about 40° C., greater than or equal to about 45° C., greater than or equal to about 50° C., greater than or equal to about 55° C., or greater than or equal to about 60° C. The alcoholic solution containing the halogen may be obtained by dissolving the metal halogen compound with a C1 to C10 alcohol.

An absorption/photoluminescence wavelength of a quantum dot may be controlled by adjusting a composition and a size of the quantum dot. A maximum photoluminescence peak wavelength of the quantum dots may be an ultraviolet (UV) to infrared wavelength or a wavelength of greater than an ultraviolet (UV) to infrared wavelength range. For example, the maximum photoluminescence peak wavelength of the quantum dots may be greater than or equal to about 300 nm, for example, greater than or equal to about 440 nm, greater than or equal to about 445 nm, greater than or equal to about 450 nm, greater than or equal to about 455 nm, greater than or equal to about 460 nm, greater than or equal to about 465 nm, greater than or equal to about 470 nm, greater than or equal to about 475 nm, greater than or equal to about 480 nm, greater than or equal to about 490 nm, greater than or equal to about 500 nm, greater than or equal to about 510 nm, greater than or equal to about 520 nm, greater than or equal to about 530 nm, greater than or equal to about 540 nm, greater than or equal to about 550 nm, greater than or equal to about 560 nm, greater than or equal to about 570 nm, greater than or equal to about 580 nm, greater than or equal to about 590 nm, greater than or equal to about 600 nm, or greater than or equal to about 610 nm. The maximum photoluminescence wavelength of the quantum dots may be less than or equal to about 800 nm, for example, less than or equal to about 650 nm, less than or equal to about 640 nm, less than or equal to about 630 nm, less than or equal to about 620 nm, less than or equal to about 610 nm, less than or equal to about 600 nm, less than or equal to about 590 nm, less than or equal to about 580 nm, less than or equal to about 570 nm, less than or equal to about 560 nm, less than or equal to about 550 nm, or less than or equal to about 540 nm. The maximum photoluminescence wavelength of the quantum dots may be in the range of about 500 nm to about 650 nm. In an embodiment, the quantum dot may emit green light and the maximum photoluminescence wavelength of the quantum dots may be in the range of about 500 nm to about 560 nm. In an embodiment, the quantum dot may emit red light and the maximum photoluminescence wavelength of the quantum dots may be in the range of about 600 nm to about 650 nm. In an embodiment, the quantum dot may emit blue light and the maximum photoluminescence wavelength of the quantum dots may be in the range of about 400 nm to about 480 nm.

The quantum dots may have quantum efficiency of greater than or equal to about 10%, for example greater than or equal to about 30%, greater than or equal to about 50%, greater than or equal to about 60%, greater than or equal to about 70%, greater than or equal to about 90%, or even about 100%. The quantum dots may have a relatively narrow spectrum. The quantum dots may have for example a full width at half maximum (FWHM) of a photoluminescence wavelength spectrum of less than or equal to about 55 nm, for example, less than or equal to about 50 nm, less than or equal to about 45 nm, less than or equal to about 40 nm, or less than or equal to about 30 nm.

The quantum dots may have a (average) particle size (e.g., determined by an electron microscopy image, a diameter or an equivalent diameter obtained under the assumption of a circle) of greater than or equal to about 1 nm and less than or equal to about 100 nm.

A size (or an average size) of the quantum dot(s) may be from about 1 nm to about 50 nm. The size (or the average size) of the quantum dot(s) may be for example, greater than or equal to about 2 nm, greater than or equal to about 3 nm, greater than or equal to about 4 nm, greater than or equal to about 5 nm, greater than or equal to about 6 nm, greater than or equal to about 7 nm, greater than or equal to about 8 nm, greater than or equal to about 9 nm, greater than or equal to about 10 nm, greater than or equal to about 11 nm, greater than or equal to about 12 nm, greater than or equal to about 13 nm, greater than or equal to about 14 nm, or greater than or equal to about 15 nm. The size (or the average size) of the quantum dot(s) may be less than or equal to about 50 nm, less than or equal to about 40 nm, less than or equal to about 30 nm, less than or equal to about 20 nm, less than or equal to about 15 nm, or less than or equal to about 10 nm.

In an embodiment, a particle size (e.g., for quantum dots or for a metal oxide nanoparticle) may be measured by using an electron microscopy analysis (e.g., transmission electron microscopy (TEM)). In an embodiment, a particle size may be measured (e.g., calculated by using a commercial image analysis program such as Image J) from a two dimensional image obtained from the electron microscope. In an embodiment, a particle size (e.g., for quantum dots or for a metal oxide nanoparticle) may be an average (e.g., a mean, mode, or median average) size.

The shapes of the quantum dots are not particularly limited. For example, the shape of the quantum dots may be a sphere, a polyhedron, a pyramid, a multipod, a regular polygonal, acube, a rectangular parallelepiped, a nanotube, a nanorod, a nanowire, a nanosheet, or a combination thereof, but is not limited thereto.

The quantum dots may not include a thiol-containing organic compound or a salt thereof bound to a surface of the plurality of quantum dots. The thiol-containing organic compound or the salt thereof may include butanethiol, pentanethiol, hexanethiol, heptanethiol, octanethiol, nonanethiol, decanethiol, undecanethiol, dodecanethiol, octadecanethiol, 2-(2-methoxyethoxy)ethanethiol, 3-methoxybutyl 3-mercaptopropionate, 3-methoxybutylmercaptoacetate, thioglycolic acid, 3-mercaptopropionic acid, thiopronin, 2-mercaptopropionic acid, a 2-mercaptopropionate ester, 2-mercaptoethanol, cysteamine, 1-thioglycerol, mercaptosuccinic acid, L-cysteine, dihydrolipoic acid, 2-(dimethylamino)ethanethiol, 5-mercaptomethyltetrazole, 2,3-dimercapto-1-propanol, glutathione, methoxypoly(ethylene glycol) thiol (m(PEG)-SH), a dialkyldithiocarbamic acid, a metal salt thereof, or a combination thereof.

In an embodiment, the emission layer 13 may include a monolayer of quantum dots. In an embodiment, the emission layer 13 may include at least one monolayer of quantum dots, for example, 2 or more monolayers, 3 or more layers, or 4 or more monolayers, and 20 or less monolayers, and 10 or less monolayers, 9 or less monolayers, 8 or less monolayers, 7 or less monolayers, or 6 or less monolayers. The emission layer 13 may have a thickness of greater than or equal to about 5 nm, for example, greater than or equal to about 10 nm, greater than or equal to about 20 nm, or greater than or equal to about 30 nm and less than or equal to about 200 nm, for example, less than or equal to about 150 nm, less than or equal to about 100 nm, less than or equal to about 90 nm, less than or equal to about 80 nm, less than or equal to about 70 nm, less than or equal to about 60 nm, or less than or equal to about 50 nm. The emission layer 13 may have for example a thickness of about 10 nm to about 150 nm, for example about 20 nm to about 100 nm, for example about 30 nm to about 50 nm.

The emission layer may have a single layer structure or a multi-layered structure wherein at least two layers are stacked. In the multi-layered structure, adjacent layers (e.g., a first emission layer and a second emission layer) may have a property or a composition that is different from each other. In an embodiment, the emission layer may have a halogen amount (e.g., a halogen concentration) varying in a thickness direction. In the emission layer of an embodiment, the amount (the concentration) of the halogen may increase toward the electron auxiliary layer. In the emission layer of an embodiment, the amount (the concentration) of the halogen may decrease toward the electron auxiliary layer.

In an embodiment, the emission layer may have a first quantum dot emission layer, a surface of which is replaced or treated with a halogen (e.g., chlorine) and a second quantum dot emission layer disposed on the first quantum dot emission layer and having an increased amount of the organic ligand. The first quantum dot emission layer may have an increased halogen amount (concentration) (e.g., a surface of the emission layer may be treated with the halogen or the emission layer includes halogen treated quantum dots). The amount of the halogen (or chlorine) or the amount of the organics, e.g., organic content, in the emission layers may be controlled by an appropriate means (e.g., a post-treatment of a formed layer in the first quantum dot emission layer for example), or inclusion of varying amounts of the organic ligand during manufacture of the second quantum dot emission layer, for example).

The emission layer 13 may have a HOMO energy level of greater than or equal to about 5.4 eV, greater than or equal to about 5.6 eV, greater than or equal to about 5.7 eV, greater than or equal to about 5.8 eV, greater than or equal to about 5.9 eV, or greater than or equal to about 6.0 eV. The emission layer 13 may have a HOMO energy level of than or equal to about 7.0 eV, less than or equal to about 6.8 eV, less than or equal to about 6.7 eV, less than or equal to about 6.5 eV, less than or equal to about 6.3 eV, or less than or equal to about 6.2 eV. In an embodiment, the emission layer 13 may have a HOMO energy level of about 5.6 eV to about 6.0 eV.

The emission layer 13 may have for example an LUMO energy level of less than or equal to about 3.8 eV, less than or equal to about 3.7 eV, less than or equal to about 3.6 eV, less than or equal to about 3.5 eV, less than or equal to about 3.4 eV, less than or equal to about 3.3 eV, less than or equal to about 3.2 eV, or less than or equal to about 3.0 eV. The emission layer 13 may have an LUMO energy level of greater than or equal to about 2.5 eV. In an embodiment, the emission layer 13 may have a bandgap energy of about 2.4 eV to about 2.9 eV.

The device of an embodiment has an electron auxiliary layer 14 disposed on (or directly on) the emission layer. In the device of an embodiment, the electron auxiliary layer that will be described in detail below may enable the device to have improved electroluminescent properties, life time properties, or a combination thereof.

The electron auxiliary layer includes a plurality of metal oxide nanoparticles. The electron auxiliary layer transport and inject the electrons to the emission layer. The metal oxide nanoparticles may include zinc and a dopant metal and the dopant metal may include Mg, Mn, Ni, Sn, Li, Al, Y, Ga, Zr, Co, or a combination thereof. In the metal oxide nanoparticle, the distribution of the dopant metal is made in a controlled manner. In an embodiment, the distribution of the dopant metal in the controlled manner can be confirmed by the properties of the metal oxide nanoparticle that will be described hereinbelow (for example, the properties of the room temperature or low temperature PL spectrum of the metal oxide nanoparticle, the composition of the metal oxide nanoparticle, or a combination thereof).

The metal oxide nanoparticles may be crystalline. The metal oxide nanoparticles may be amorphous.

The dopant metal may include magnesium, aluminum, lithium, or a combination thereof.

In the metal oxide nanoparticles, a mole ratio of the dopant metal (e.g., magnesium, aluminum, lithium, or a combination thereof) with respect to the zinc in the metal oxide nanoparticles may be greater than or equal to about 0.005:1, greater than or equal to about 0.01:1, greater than or equal to about 0.02:1, greater than or equal to about 0.03:1, greater than or equal to about 0.04:1, greater than or equal to about 0.05:1, greater than or equal to about 0.06:1, greater than or equal to about 0.07:1, greater than or equal to about 0.08:1, greater than or equal to about 0.09:1, greater than or equal to about 0.1:1, greater than or equal to about 0.11:1, greater than or equal to about 0.12:1, greater than or equal to about 0.13:1, greater than or equal to about 0.14:1, greater than or equal to about 0.15:1, greater than or equal to about 0.16:1, greater than or equal to about 0.17:1, greater than or equal to about 0.18:1, greater than or equal to about 0.19:1, greater than or equal to about 0.2:1, greater than or equal to about 0.21:1, greater than or equal to about 0.22:1, greater than or equal to about 0.23:1, greater than or equal to about 0.24:1, greater than or equal to about 0.25:1, greater than or equal to about 0.26:1, greater than or equal to about 0.27:1, greater than or equal to about 0.28:1, greater than or equal to about 0.29:1, greater than or equal to about 0.3:1, greater than or equal to about 0.31:1, greater than or equal to about 0.32:1, greater than or equal to about 0.33:1, greater than or equal to about 0.34:1, greater than or equal to about 0.35:1, greater than or equal to about 0.36:1, greater than or equal to about 0.37:1, greater than or equal to about 0.38:1, greater than or equal to about 0.39:1, greater than or equal to about 0.4:1, greater than or equal to about 0.41:1, greater than or equal to about 0.42:1, greater than or equal to about 0.43:1, greater than or equal to about 0.44:1, greater than or equal to about 0.45:1, greater than or equal to about 0.46:1, greater than or equal to about 0.47:1, greater than or equal to about 0.48:1, or greater than or equal to about 0.49:1.

In the metal oxide nanoparticles, a mole ratio of the dopant metal with respect to the metal (i.e., the zinc) in the metal oxide nanoparticles may be less than or equal to about 0.5:1, less than or equal to about 0.49:1, less than or equal to about 0.48:1, less than or equal to about 0.47:1, less than or equal to about 0.46:1, less than or equal to about 0.45:1, less than or equal to about 0.44:1, less than or equal to about 0.43:1, less than or equal to about 0.42:1, less than or equal to about 0.41:1, less than or equal to about 0.4:1, less than or equal to about 0.39:1, less than or equal to about 0.38:1, less than or equal to about 0.37:1, less than or equal to about 0.36:1, less than or equal to about 0.35:1, less than or equal to about 0.34:1, less than or equal to about 0.33:1, less than or equal to about 0.32:1, less than or equal to about 0.31:1, less than or equal to about 0.3:1, less than or equal to about 0.29:1, less than or equal to about 0.28:1, less than or equal to about 0.27:1, less than or equal to about 0.26:1, less than or equal to about 0.25:1, less than or equal to about 0.24:1, less than or equal to about 0.23:1, less than or equal to about 0.22:1, less than or equal to about 0.21:1, less than or equal to about 0.2:1, less than or equal to about 0.19:1, less than or equal to about 0.18:1, less than or equal to about 0.17:1, less than or equal to about 0.16:1, or less than or equal to about 0.15:1.

In the device, an absolute value of a difference between a conduction band-edge of the electron auxiliary layer and a work function of a second electrode may be less than or equal to about 0.4 eV, less than or equal to about 0.3 eV, less than or equal to about 0.2 eV, or less than or equal to about 0.1 eV. In the device, an absolute value of a difference between a conduction band-edge of the electron auxiliary layer and a LUMO energy level of the emission layer may be less than or equal to about 0.4 eV, less than or equal to about 0.3 eV, less than or equal to about 0.2 eV, or less than or equal to about 0.1 eV.

A quantum dot light emitting device (hereinafter, also referred to as QD-LED) including quantum dots may emit light by application of a voltage. In the case of a QD-LED, a specific operating principle is different from that of Organic Light Emitting Diode (OLED). A QD-LED may realize, e.g., emit, a color (Red, Green, Blue) of light with a higher color purity, achieving improved color reproducibility. A next generation display device may include a QD-LED. During the production of a QD-LED, many steps can be carried out in a solution based manner and thereby a production cost of the QD-LED may be reduced. A QD-LED is based on an inorganic light emitting material, which may provide enhanced stability. However, desired is development of a technology that can improve the luminous properties and the life time properties of a QD-LED.

In a QD-LED, holes and electrons provided from two electrodes (e.g., a cathode and an anode) facing each other may pass, e.g., through, a hole auxiliary layer (e.g., a hole transporting layer) and an electron auxiliary layer (e.g., an electron transporting layer) and reach the emission layer (EML) to recombine to emit light. An electron auxiliary layer that is based on nanoparticles may be formed on the quantum dot EML at a relatively low temperature via a solution process.

A QD-LED showing, e.g., exhibiting, a desired level of, e.g., desirable, properties may include a toxic heavy metal such as cadmium in the quantum dots of the EML. However, in the case of a QD-LED based on an environmentally friendly material such as a cadmium free quantum dot, it may be difficult, e.g., challenging, to achieve a desired level of luminous properties. The present inventors have found that it may be difficult for an emission layer including a cadmium free quantum dot to achieve a desired level of luminous properties even when being combined with an electron auxiliary layer (e.g., electron transport layer) containing zinc metal oxide nanoparticles. Without wishing to be bound by any theory, it is believed that the zinc metal oxide may have a relatively low level of resistivity and may exhibit, e.g., uncontrollably, increased electron mobility, and it may be difficult for the electron auxiliary layer including a zinc metal oxide nanoparticle to achieve a desired charge balance with an emission layer including cadmium free quantum dots.

The nanoparticle may include a metal dopant and an energy level of the nanoparticle may be affected by the metal dopant. Accordingly, in order to achieve a charge balance with the emission layer, a dopant may be added to the zinc oxide nanoparticles. The present inventors have found that it may also be difficult for a QD-LED including a zinc oxide metal nanoparticle having the dopant to achieve a desirable improvement of properties. Without wishing to be bound by any theory, it is believed that the addition of the dopant may cause not only an increase of a resistivity but also an increase of a contact resistance, the latter of which may have a seriously adverse effect on the electron movement efficiency between the electron auxiliary layer and the emission layer (or the electrode).

Contact resistance is a parameter different from resistivity. Contact resistance is a type of resistance against a current flow due to a surface state and other causes arising on contact. Without wishing to be bound by any theory, in the case of a QD-LED, the traps present in the materials of the electron auxiliary layer may have a positive effect on the electron flow toward the emission layer, and the addition of the dopant may change the bandgap energy of the materials of the electron auxiliary layer and at the same time may have an effect on (e.g., decrease) the number of the traps present in the metal oxide nanoparticle. When the dopant is added in order to change the bandgap energy to a desired level, the number of the traps in the materials of the electron auxiliary layer may significantly decrease and thereby the electron movement in the electron auxiliary layer may be adversely affected.

In the light emitting device of an embodiment, the zinc containing metal oxide included in the electron auxiliary layer includes the dopant (for example, by the following manner) in such a manner that the distribution of the dopant is spatially controlled. In at least one of the metal oxide nanoparticles, the dopant metal is included in the metal oxide nanoparticle to have a concentration gradient. In an embodiment, a concentration gradient of a given matter may refers to the case where the given matter is more concentrated (e.g., present in a greater amount) in one area (e.g., inner, center, or core region) than another (e.g., an outer, circumferential, or shell) in a given object. In the metal oxide, the distribution of the dopant may not be random or equal throughout the nanoparticle.

In an embodiment, in at least one of the metal oxide nanoparticles, a molar amount or a concentration (e.g., number of moles per volume or weight per volume) of the dopant in an inner (a center) portion of the particle may be different from (e.g., greater or less than) that in an outer (or peripheral portion) of the particle. For example, a molar amount or a concentration of the dopant may increases in a direction from an inner portion to an outer portion of the nanoparticle, or increases in a direction from the outer portion to the inner portion of the nanoparticle. In other embodiment, a molar amount or a concentration of the dopant in at least one of the metal oxide nanoparticles may increase in a direction from a core to a shell of the nanoparticle, or increases in a direction from the shell to the core of the nanoparticle. When the core or at least one shell having a controlled distribution is present, it is also possible to have a core, an inner shell, an intermediate shell, or outer shell in the metal oxide nanoparticle where the spatial distribution of the dopant is not controlled.

In an embodiment, the dopant (e.g., the magnesium) may be distributed more predominantly in an inner portion (e.g., a core) of the metal oxide nanoparticle. Based on a total size (or diameter) of the particle, a size (or a diameter) of the inner portion (e.g., core) may be about 1% to about 99%, about 5% to about 95%, about 10% to about 90%, about 15% to about 85%, about 20% to about 80%, about 25% to about 75%, about 30% to about 70%, about 35% to about 65%, about 40% to about 60%, or about 45% to about 55% or any combined range having (upper and lower) limits recited. For example, greater than or equal to about 70 mole percent to about 100 mole percent, greater than or equal to about 80 mole percent, greater than or equal to about 90 mole percent, greater than or equal to about 95 mole percent, or 100 mole percent of the dopant metal may be present in the inner portion (e.g., core) of the metal oxide nanoparticle, based on a total number of moles of the dopant present in the metal oxide nanoparticle. In an embodiment, the dopant (e.g., the magnesium) may be not substantially distributed (present) in an outer or surface portion (e.g., a shell) of the metal oxide nanoparticle.

In an embodiment, the dopant (e.g., the magnesium) may be substantially distributed in an outer or surface portion (e.g., a shell) of the metal oxide nanoparticle. Based on a total size (or diameter) of the particle, a size (or a thickness) of the outer portion (e.g., shell) may be about 1% to about 99%, about 5% to about 95%, about 10% to about 90%, about 15% to about 85%, about 20% to about 80%, about 25% to about 75%, about 30% to about 70%, about 35% to about 65%, about 40% to about 60%, or about 45% to about 55% or any combined range having (upper and lower) limits recited herein. In an embodiment, a metal oxide nanoparticle consists of the inner portion and the outer portion and a thickness of the outer portion shell may be from about 1% (or 5%) to about 20% (or 15%), based on a total size (or diameter) of the particle. For example, greater than or equal to about 70 mole percent to about 100 mole percent, greater than or equal to about 80 mole percent, greater than or equal to about 90 mole percent, greater than or equal to about 95 mole percent, or 100 mole percent of the dopant metal may be present in the outer or surface portion (e.g., shell) of the metal oxide nanoparticle, based on a total number of moles of the dopant present in the metal oxide nanoparticle.

In an embodiment, the dopant (e.g., the magnesium) may be not substantially distributed (present) in an inner or center portion (e.g., a core) of the metal oxide nanoparticle.

In an embodiment, the metal oxide nanoparticle may include at least two dopants (e.g., a first dopant and a second dopant), wherein a concentration of each of the dopants may be different in the inner and outer portions of the metal oxide nanoparticle. For example, the first dopant may be predominant in the inner portion (e.g., the core) of the metal oxide nanoparticle and the second dopant may be predominant in the outer portion (e.g., the shell). Examples of the first dopant and the second dopant are the same as set forth herein.

The present inventors have found that such a controlled distribution of the dopant may be confirmed by the properties of the resulting metal oxide nanoparticle. In other words, a property (or a combination thereof) of the resulting metal oxide nanoparticle may represent the distribution of the dopant therein (for example, taking a composition of the metal oxide nanoparticle into account together). When the zinc metal containing, e.g., zinc oxide, nanoparticles include the dopant distributed in a controlled manner in a predetermined amount, the zinc metal containing nanoparticles may exhibit electrical properties and optical properties different from particles that include the same amount of the dopant in a non-controlled manner. In the metal oxide nanoparticles included in the electron auxiliary layer of the device of an embodiment, the distribution of the dopant is spatially controlled, e.g., non-random, whereby the number of the traps included (e.g., at the surfaces thereof) in the metal oxide nanoparticles may be controlled (e.g., increased) and the controlled (increased) number of the traps may play a role of electron movement path toward the emission layer.

In the light emitting device of an embodiment, the metal oxide nanoparticles included in the electron auxiliary layer include a predetermined types/amount of the dopant in a controlled distribution and whereby the optical properties thereof may be changed (e.g., the trap emission may increase).

The metal oxide nanoparticles may have a first UV-Vis absorption peak wavelength of less than or equal to about 350 nm, less than or equal to about 345 nm, or less than or equal to about 340 nm. The metal oxide nanoparticles may have a first UV absorption peak wavelength of greater than or equal to about 300 nm, greater than or equal to about 310 nm, greater than or equal to about 315 nm, greater than or equal to about 320 nm, greater than or equal to about 325 nm, or greater than or equal to about 330 nm.

The metal oxide nanoparticles may be configured to exhibit a trap emission peak having a center wavelength of greater than or equal to about 500 nm or greater than or equal to about 510 nm (e.g, a room temperature or low temperature PL analysis). The center wavelength of the trap emission peak may be less than or equal to about 600 nm or less than or equal to about 560 nm. The metal oxide nanoparticles may be configured to exhibit a band-edge emission peak having a center wavelength of less than or equal to about 400 nm or less than or equal to about 390 nm. The center wavelength of the band-edge emission peak may be greater than or equal to about 200 nm to 350 nm or greater.

A maximum intensity ratio of the trap emission peak with respect to the band-edge emission peak may be greater than or equal to about 2.9:1, greater than or equal to about 3:1, greater than or equal to about 3.5:1, greater than or equal to about 4:1, greater than or equal to about 4.5:1, greater than or equal to about 5:1, greater than or equal to about 5.5:1, greater than or equal to about 6:1, greater than or equal to about 6.5:1, greater than or equal to about 7:1, greater than or equal to about 7.5:1, greater than or equal to about 8:1, greater than or equal to about 8.5:1, or greater than or equal to about 9:1.

A maximum intensity ratio of the trap emission peak with respect to the band-edge emission peak may be less than or equal to about 50:1, less than or equal to about 40:1, less than or equal to about 30:1, less than or equal to about 20:1, or less than or equal to about 15:1.

A maximum intensity ratio of the trap emission peak with respect to the band-edge emission peak may be determined by using a low temperature photoluminescent measurement measured for example at 77 K.

In the light emitting device of an embodiment, the metal oxide nanoparticles included in the electron auxiliary layer includes the dopant in a controlled distribution, and the electrical properties may be changed, exhibiting a desired combination of resistivity and contact resistance.

The resistivity of the metal oxide nanoparticles may be greater than or equal to about $1 \times 10^4$ ohm·cm, greater than or equal to about $1 \times 10^5$ ohm·cm, greater than or equal to about $3 \times 10^8$ ohm·cm, greater than or equal to about $3.3 \times 10^8$ ohm·cm, greater than or equal to about $3.5 \times 10^8$ ohm·cm, greater than or equal to about $3.7 \times 10^8$ ohm·cm, greater than or equal to about $3.9 \times 10^8$ ohm·cm.

The contact resistance of the metal oxide nanoparticles may be less than or equal to about $5 \times 10^{11}$ ohm·cm$^2$, less than or equal to about $4 \times 10^{11}$ ohm·cm$^2$, less than or equal to about $3 \times 10^{11}$ ohm·cm$^2$, less than or equal to about $2 \times 10^{11}$ ohm·cm$^2$, less than or equal to about $1.5 \times 10^{11}$ ohm·cm$^2$, less than or equal to about $1.4 \times 10^{11}$ ohm·cm$^2$, less than or equal to about $1.3 \times 10^{11}$ ohm·cm$^2$, less than or equal to about $1.2 \times 10^{11}$ ohm·cm$^2$, less than or equal to about $1.1 \times 10^{11}$ ohm·cm$^2$, less than or equal to about $1 \times 10^{11}$ ohm·cm$^2$, or less than or equal to about $1 \times 10^{10}$ ohm·cm.

In the light emitting device of an embodiment, the metal oxide nanoparticles included in the electron auxiliary layer may have an amount of organics of greater than or equal to about 20%, greater than or equal to about 24%, or greater than or equal to about 25% as determined by a thermogravimetric analysis. The metal oxide nanoparticles included in the electron auxiliary layer may have an amount of organics of 40%, less than or equal to about 35%, or less than or equal to about 30% as determined by a thermogravimetric analysis.

In an embodiment, the metal oxide nanoparticles (e.g., including zinc) may have a core-shell structure. The core-shell structure may include a core including a first metal oxide and a shell disposed on the core and including a second metal oxide having a different composition from the first metal oxide. The first metal oxide may include zinc and a first metal and the first metal may include magnesium, aluminum, lithium, yttrium, gallium, zirconium, nickel, cobalt, or a combination thereof. The second metal oxide may include zinc and a second metal and the second metal may include magnesium, aluminum, lithium, yttrium, gallium, zirconium, nickel, cobalt, or a combination thereof. In an embodiment, a bandgap energy of the first metal oxide may be greater than that of the second metal oxide. In an embodiment, a bandgap energy of the second metal oxide may be greater than that of the first metal oxide.

The first metal oxide may include a compound represented by Chemical Formula 1:

$$Zn_{1-x}A_xO \qquad \text{Chemical Formula 1}$$
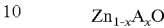

in Chemical Formula 1, A is Mg, Mn, Ni, Li, Sn, Al, Y, Ga, Zr, Co, or a combination thereof, and 0≤x<1, for example, 0≤x≤0.5.

The second metal oxide may include a compound represented by Chemical Formula 2:

$$Zn_{1-y}M_yO \qquad \text{Chemical Formula 2}$$

in Chemical Formula 2, M is Mg, Mn, Ni, Li, Sn, Al, Y, Ga, Zr, Co or a combination thereof, and 0≤y<1, for example, 0≤y≤0.5.

The first metal oxide may include metal A, the second metal oxide may include metal M, or a combination thereof.

In an embodiment, the first metal oxide includes the first metal and a mole ratio of the first metal with respect to the zinc may be less than or equal to about 0.5:1, for example, less than or equal to about 0.4:1, less than or equal to about 0.3:1. The first metal oxide includes magnesium and a mole ratio of the magnesium with respect to the zinc may be less than or equal to about 0.3:1.

Figure 2:
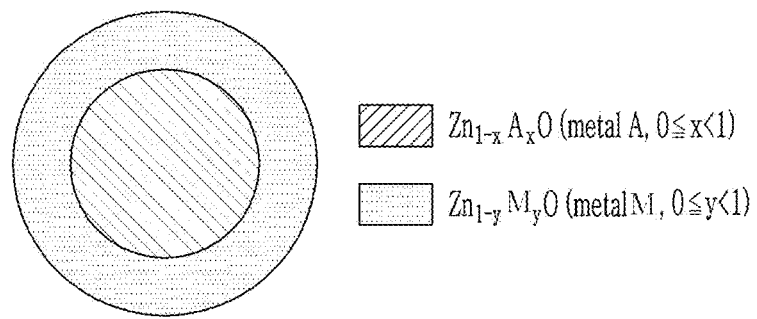
FIG. 2 is a schematic cross-sectional view of a metal oxide nanoparticle included in an electron auxiliary layer of a light emitting device according to an embodiment.

Referring to FIG. 2, in the metal oxide nanoparticle, the core may include a first metal oxide including zinc and a first metal dopant (A). The shell may include a second metal oxide including zinc and a second metal dopant (M). The first metal oxide may include the first metal dopant (A), the second metal oxide may include the second metal dopant (M), or a combination thereof. In an embodiment, the first metal oxide may include $Zn_{1-x}Mg_xO$ (0≤x<1, for example, 0<x≤0.5), and the second metal oxide may include zinc oxide represented by ZnO. In an embodiment, the second metal oxide may include $Zn_{1-x}Mg_xO$ (0≤x<1, for example, 0<x≤0.5), and the first metal oxide may include zinc oxide represented by ZnO.

In the metal oxide nanoparticle, a size (or an average size) of the core may be greater than or equal to about 1 nm, greater than or equal to about 1.5 nm, greater than or equal to about 2 nm, greater than or equal to about 2.5 nm, or greater than or equal to about 3 nm. In the metal oxide nanoparticle, a size (or an average size) of the core may be less than or equal to about 9 nm, less than or equal to about 8 nm, less than or equal to about 7 nm, less than or equal to about 6 nm, less than or equal to about 5 nm, or less than or equal to about 4 nm. In the metal oxide nanoparticle, a thickness (or an average thickness) of the shell may be greater than or equal to about 0.1 nm, greater than or equal to about 0.2 nm, greater than or equal to about 0.3 nm, greater than or equal to about 0.4 nm, or greater than or equal to about 0.5 nm. In the metal oxide nanoparticle, a thickness (or an average thickness) of the shell may be less than or equal to about 1 nm, less than or equal to about 0.9 nm, less than or equal to about 0.8 nm, less than or equal to about 0.7 nm, or less than or equal to about 0.6 nm.

The first metal oxide may include a zinc magnesium oxide, and the second metal oxide may include a zinc oxide. The second metal oxide may not include magnesium, aluminum, lithium, yttrium, gallium, zirconium, nickel, cobalt, or a combination thereof.

The average size of the metal oxide nanoparticles may be greater than or equal to about 2 nm, greater than or equal to about 2.5 nm, greater than or equal to about 3 nm, greater than or equal to about 3.5 nm, or greater than or equal to about 4 nm. The average size of the metal oxide nanoparticles may be less than or equal to about 10 nm, less than or equal to about 8 nm, less than or equal to about 6 nm, or less than or equal to about 4 nm. The average size of the metal oxide nanoparticles may be from about 3 nm (or 3.2 nm or 3.3 nm) to about 6 nm (or 5 nm or 4.5 nm or 4 nm).

In an embodiment, the metal oxide nanoparticles (e.g., including the first metal oxide and the second metal oxide) may be prepared by, providing a first organic solution including a first zinc precursor, a first organic solvent, and optionally a first dopant precursor;

adding a hydroxide containing solution to the first organic solution and stirring a resulting mixture to form a precipitate;

separating the precipitate as formed;

dispersing the separated precipitate to form a dispersion;

mixing the dispersion with a second organic solution including a second zinc precursor, a second organic solvent, and optionally a second dopant precursor and adding a hydroxide containing solution to a mixture and stirring the same to form a zinc containing zinc oxide nanoparticle, wherein the first organic solution includes the first dopant precursor; the second organic solution includes the second dopant precursor; or the first organic solution includes the first dopant precursor and the second organic solution includes the second dopant precursor.

Details of the metal oxide nanoparticle are the same as set forth herein.

In an embodiment, the first organic solution may be optionally heated to a first temperature. The dispersion may be optionally heated to a second temperature. The first temperature and the second temperature may be the same or different. The first temperature and the second temperature may be each independently greater than or equal to about 30° C., greater than or equal to about 40° C., or greater than or equal to about 50° C. The first temperature and the second temperature may be each independently be less than or equal to about 100° C., less than or equal to about 80° C., or less than or equal to about 70° C.

The formed precipitation may be optionally washed with a C1 to C10 alcohol solvent such as ethanol, methanol, propanol, or like, a C1 to C10 ester solvent such as an alkyl acetate, a C1 to C20 amine solvent, a C1 to C20 amide solvent such dimethylformamide (DMF), a C1 to C20 sulfoxide such as dimethylsulfoxide (DMSO), or a combination thereof.

The first zinc precursor and the second zinc precursor (hereinafter, referred to as zinc precursor) may be the same or different. The zinc precursor may include a C1 to C30 zinc carboxylate (e.g., acetate).

Types and amounts of the first dopant precursor and the second dopant precursor may be each independently selected taking into consideration a desired distribution of the dopant.

The first dopant precursor may include the dopant metal. The second dopant precursor may include the dopant metal. The first dopant precursor and the second dopant precursor (hereinafter, the dopant precursor) may be the same or different. The dopant precursor may include a C1 to C30 metal carboxylate (e.g., acetate). The dopant precursor may include magnesium.

In an embodiment, the first organic solution may include the first dopant precursor and the second organic solution may not include the second dopant precursor. In an embodiment, the first organic solution may not include the first dopant precursor and the second organic solution may include the second dopant precursor. In an embodiment, the first organic solution may include the first dopant precursor and the second organic solution may include the second dopant precursor. The concentration of the dopant precursor included in the first organic solution, the second organic solution, or a combination thereof may be determined taking a desired composition of the final metal oxide nanoparticle and a desired distribution of the dopant therein.

Types of the dispersing solvent, the first organic solvent, and the second organic solvent may be determined appropriately taking into consideration of types of the zinc/dopant precursors and the reaction temperature.

The first organic solvent and the second organic solvent (hereinafter, the organic solvent) may be the same or different. The organic solvent may include a C1 to C30 alcohol solvent, an amide solvent such as DMF, a sulfoxide solvent such as DMSO, an ether solvent, an alkyl ester solvent, or a combination thereof.

Concentrations of the precursors (e.g., the zinc precursor, the first dopant precursor, or a combination thereof) in the first organic solution may be controlled appropriately taking into consideration the types of the used precursors, the reaction temperature, and the composition of the final nanoparticles. Concentrations of the precursors (e.g., the zinc precursor, the second dopant precursor, or a combination thereof) in the second organic solution may be controlled appropriately taking into consideration the amount of the precipitate from the dispersion, and the composition of the final nanoparticles. In an embodiment, a concentration of the zinc precursor may be about 0.01 M to about 10 M, about 0.05 M to about 5M, about 0.07 M to about 1 M, 0.1 M to 0.5 M, or any combined range having both limits recited herein. A concentration of the dopant precursor may be controlled in light of the zinc precursor and a desired composition of the metal oxide nanoparticle.

The hydroxide containing solution may include a hydroxide compound. The hydroxide compound may include an alkali metal hydroxide (e.g., NaOH, KOH, or the like), alkali earth metal hydroxide, alkyl ammonium hydroxide (e.g., trimethylammonium hydroxide), or a combination thereof. An amount of the hydroxide compound may be adjusted considering the amount of the used metal precursor. In an embodiment, the hydroxide compound may be used in a stoichiometric amount, but it is not limited thereto.

Thickness of the electron auxiliary layer may be selected appropriately taking into consideration the emission wavelength of the quantum dot emission layer, a thickness of the emission layer, or the like. Thickness of the electron auxiliary layer may be greater than or equal to about 10 nm, greater than or equal to about 11 nm, greater than or equal to about 12 nm, greater than or equal to about 15 nm, greater than or equal to about 20 nm, greater than or equal to about 25 nm and less than or equal to about 100 nm, less than or equal to about 90 nm, less than or equal to about 80 nm, less than or equal to about 70 nm, less than or equal to about 60 nm, or less than or equal to about 50 nm.

The light emitting device 1 may further include a first electrode and a second electrode facing each other, and the emission layer may be disposed between the first electrode 11 and the second electrode 15. One of the first electrode 11 and the second electrode 12 may be anode and another may be cathode. Hereinafter, the description is made of a case in which the first electrode is anode, but is not limited thereto.

A hole auxiliary layer 12 may be disposed between the first electrode 11 and the emission layer 13. The electron auxiliary layer 13 may be disposed between the second electrode 12 and the emission layer 13.

The light emitting device 1 may further include a substrate. The substrate may be disposed on a major surface of the first electrode 11 or on a major surface of the second electrode 15. In an embodiment, the substrate may be disposed on a major surface of the first electrode (e.g., below the first electrode). The substrate may be a substrate including an insulation material. The substrate may be insulating, a transparent, or a combination thereof. The substrate may include glass; various polymers such as polyesters (e.g., polyethylene terephthalate (PET), polyethylene naphthalate (PEN)), polycarbonate, polyacrylate, polyimide, and polyamideimide; polysiloxane (e.g., polydimethylsiloxane (PDMS)); inorganic materials such as $Al_2O_3$ and ZnO; or a combination thereof, but is not limited thereto. The substrate may be made of a silicon wafer. Herein "transparent" may refer to transmittance for light of a predetermined wavelength (e.g., light emitted from the quantum dots) of greater than or equal to about 85%, for example, greater than or equal to about 88%, greater than or equal to about 90%, greater than or equal to about 95%, greater than or equal to about 97%, or greater than or equal to about 99%. A thickness of the substrate may be appropriately selected taking into consideration a substrate material but is not particularly limited. The transparent substrate may have flexibility. The substrate may be omitted.

The first electrode 11 may be made of a conductor, for example a metal, a conductive metal oxide, or a combination thereof. The first electrode 11 may be for example made of a metal or an alloy thereof such as nickel, platinum, vanadium, chromium, copper, zinc, and gold; a conductive metal oxide such as zinc oxide, indium oxide, tin oxide, indium tin oxide (ITO), indium zinc oxide (IZO), or fluorine doped tin oxide; or a combination of a metal and a metal oxide such as ZnO and Al or $SnO_2$ and Sb, but is not limited thereto. In an embodiment, the first electrode may include a transparent conductive metal oxide, for example, indium tin oxide. A work function of the first electrode may be higher than a work function of the second electrode that will be described later. A work function of the first electrode may be lower than a work function of the second electrode.

The second electrode 15 may be made of a conductor, for example a metal, a conductive metal oxide, a conductive polymer, or a combination thereof. The second electrode 15 may be for example a metal or an alloy thereof such as aluminum, magnesium, calcium, sodium, potassium, titanium, indium, yttrium, lithium, gadolinium, silver, tin, lead, cesium, or barium; a multi-layer structured material such as LiF/Al, $Li_2O$/Al, 8-hydroxyquinolinolato-lithium (Liq)/Al, LiF/Ca, and $BaF_2$/Ca, but is not limited thereto. In an embodiment, the second electrode may include a transparent conductive metal oxide, for example, indium tin oxide. Examples of the conductive metal oxide are the same as described herein.

In an embodiment, a work function of the first electrode (e.g., anode) may be greater than or equal to about 4.0 eV, greater than or equal to about 4.1 eV, greater than or equal to about 4.2 eV, greater than or equal to about 4.3 eV, greater than or equal to about 4.4 eV, greater than or equal to about 4.5 eV, greater than or equal to about 4.6 eV, greater than or equal to about 4.7 eV, or greater than or equal to about 4.8 eV and less than or equal to about 5.5 eV, less than or equal to about 5.4 eV, less than or equal to about 5.3 eV, less than or equal to about 5.2 eV, less than or equal to about 5.1 eV, less than or equal to about 5.0 eV, or less than or equal to about 4.9 eV.

In an embodiment, a work function of the second electrode (e.g., cathode) may be greater than or equal to about 3.4 eV, greater than or equal to about 3.5 eV, greater than or equal to about 3.6 eV, greater than or equal to about 3.7 eV, greater than or equal to about 3.8 eV, greater than or equal to about 3.9 eV, greater than or equal to about 4.0 eV, greater than or equal to about 4.1 eV, greater than or equal to about 4.2 eV, greater than or equal to about 4.3 eV, greater than or equal to about 4.4 eV, or greater than or equal to about 4.5 eV and less than or equal to about 5.0 eV, less than or equal to about 4.9 eV, less than or equal to about 4.8 eV, less than or equal to about 4.7 eV, less than or equal to about 4.6 eV, less than or equal to about 4.5 eV, or less than or equal to about 4.4 eV.

The first electrode 11, the second electrode 15, or a combination thereof may be a light-transmitting electrode and the light-transmitting electrode may be for example made of a conductive oxide such as a zinc oxide, indium oxide, tin oxide, indium tin oxide (ITO), indium zinc oxide (IZO), or fluorine doped tin oxide, or a metal thin layer of a single layer or a multilayer. When one of the first electrode 11 and the second electrode 15 is a non-light-transmitting electrode, the non-light-transmitting electrode may be made of for example an opaque conductor such as aluminum (Al), silver (Ag), or gold (Au).

A thickness of the electrodes (the first electrode, the second electrode, or a combination thereof) is not particularly limited and may be appropriately selected taking into consideration device efficiency. For example, the thickness of the electrodes may be greater than or equal to about 5 nm, for example, greater than or equal to about 50 nm. For example, the thickness of the electrodes may be less than or equal to about 100 micrometers (μm), for example, less than or equal to about 10 μm, less than or equal to about 1 μm, less than or equal to about 900 nm, less than or equal to about 500 nm, or less than or equal to about 100 nm.

The hole auxiliary layer 12 may be disposed between the first electrode 11 and the emission layer 13. The hole auxiliary layer 12 may have one layer or two or more layers, and may include for example a hole injection layer (HIL), a hole transport layer (HTL), an electron blocking layer, or a combination thereof.

The hole auxiliary layer 12 may have a HOMO energy level that may match a HOMO energy level of the emission layer 13 and may enforce, e.g., aid, mobility of holes from the hole auxiliary layer 12 into the emission layer 13.

The HOMO energy level of the hole auxiliary layer 12 (e.g., hole transport layer (HTL)) contacting the emission layer may be adjusted appropriately taking into consideration the HOMO of the emission layer 13. In an embodiment, the hole auxiliary layer may include a hole injection layer near to the first electrode 11 and a hole transporting layer near to the emission layer 13.

A material included in the hole auxiliary layer 12 is not particularly limited and may include for example poly(9,9-dioctyl-fluorene-co-N-(4-butylphenyl)-diphenylamine) (TFB), polyarylamine, poly(N-vinylcarbazole), poly(3,4-ethylenedioxythiophene) (PEDOT), poly(3,4-ethylenedioxythiophene) polystyrene sulfonate (PEDOT:PSS), polyaniline, polypyrrole, N,N,N',N'-tetrakis(4-methoxyphenyl)-benzidine (TPD), 4,4'-bis[N-(1-naphthyl)-N-phenyl-amino]biphenyl (α-NPD), m-MTDATA (4,4',4''-tris[phenyl(m-tolyl)amino]triphenylamine), 4,4',4''-tris(N-carbazolyl)- triphenylamine (TCTA), 1,1-bis[(di-4-tolylamino) phenylcyclohexane (TAPC), p-type metal oxide (e.g., NiO, WO$_3$, MoO$_3$, etc.), a carbon-based material such as graphene oxide, or a combination thereof, but is not limited thereto.

In an embodiment, a thickness of the hole auxiliary layer (e.g., a hole transporting layer, a hole injection layer, or a combination thereof) may be greater than or equal to about 10 nm, for example, greater than or equal to about 15 nm, greater than or equal to about 20 nm and less than or equal to about 100 nm, for example, less than or equal to about 90 nm, less than or equal to about 80 nm, less than or equal to about 70 nm, less than or equal to about 60 nm, or less than or equal to about 50 nm, but is not limited thereto.

The hole injection layer, the hole transport layer, or a combination thereof may be formed by a solution process (e.g., a spin coating). The hole injection layer, the hole transport layer, or a combination thereof may be formed by a deposition process (e.g., a physical or chemical deposition).

Figure 1B:
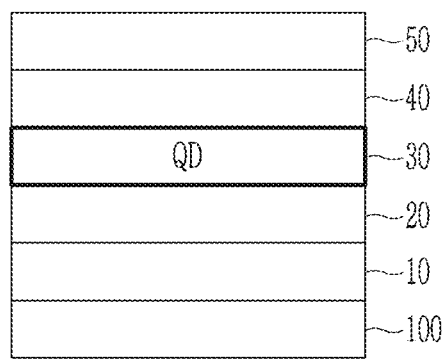
FIG. 1B is a schematic cross-sectional view of a light emitting device according to an embodiment.

A device according to an embodiment may have a normal structure. In a device of an embodiment, an anode 10A disposed on a transparent substrate 100 may include a metal oxide-based transparent electrode (e.g., ITO electrode) and a cathode 50 facing the anode may include a metal (Mg, Al, etc.) of a relatively low work function. For example, a hole auxiliary layer 20, for example, a hole transport layer including TFB, poly(9-vinylcarbazole) (PVK), or a combination thereof; a hole injection layer including PEDOT:PSS, a p-type metal oxide, or a combination thereof; or a combination thereof may be disposed between the transparent electrode 10 and the emission layer 30. An electron auxiliary layer 40 such as an electron injection layer/transport layer may be disposed between the quantum dot (QD) emission layer 30 and the cathode 50. (see FIG. 1B)

Figure 1C:
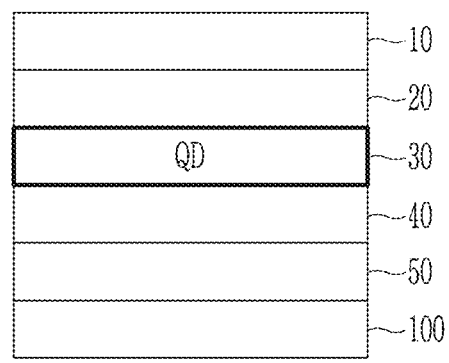
FIG. 1C is a schematic cross-sectional view of a light emitting device according to an embodiment.

A device according to an embodiment has an inverted structure. Herein, the cathode 50 disposed on a transparent substrate 100 may include a metal oxide-based transparent electrode (e.g., ITO) and the anode 10 facing the cathode may include a metal (e.g., Au, Ag, etc.) of a relatively high work function. For example, an n-type metal oxide (ZnO) may be disposed between the transparent electrode 50 and the emission layer 30 as an electron auxiliary layer 40 (e.g., an electron transport layer (ETL)). A hole auxiliary layer 20 (e.g., a hole transport layer (HTL) including TFB, PVK, or a combination thereof a hole injection layer (HIL) including MoO$_3$ or another p-type metal oxide, or a combination thereof) may be disposed between the metal anode 10 and the quantum dot emission layer 30 as a hole auxiliary layer (e.g., hole transport layer (HTL)). (see FIG. 1C)

The device of an embodiment may be prepared in an appropriate manner. In an embodiment, the electroluminescent device may be prepared by forming a charge (e.g., hole) auxiliary layer on a substrate having an electrode thereon (e.g., via deposition or coating), forming an emissive layer including the quantum dots (e.g., a pattern of the aforementioned quantum dots) thereon (e.g., via deposition or coating), and forming an electrode (optionally together with a charge (e.g., electron) auxiliary layer) thereon (e.g., via deposition or coating). The formation of the electrode/hole auxiliary layer/electron auxiliary layer is not particularly limited and may be selected appropriately.

In an embodiment, a method of manufacturing the aforementioned light emitting device includes, providing a first electrode, optionally forming a hole auxiliary layer on the first electrode, forming an emission layer on the first electrode (or optionally the hole auxiliary layer), forming an electron auxiliary layer on the emission layer as described herein, and forming a second electrode (e.g., a cathode) on the electron auxiliary layer, wherein the formation of the electron auxiliary layer includes depositing the zinc containing metal oxide nanoparticles as set forth herein on the emission layer.

Details of the first electrode, the hole auxiliary layer, the second electrode, are as described herein. The technical means of forming each of these device structure elements is well known to those of ordinary skill, and are selected appropriately taking into consideration the type of materials in the forming of each structural device element, and thickness of the electrodes and the hole auxiliary layer. The manner of forming may include a solution process, a deposition process, or a combination thereof. In an embodiment, the aforementioned hole auxiliary layer 12, the emissive layer including quantum dots 13, and the electron auxiliary layer 14 may be formed with a solution process, for example spin coating, slit coating, inkjet printing, nozzle printing, spraying, a doctor blade coating, or a combination thereof, but is not limited thereto.

The forming of the emission layer may be performed by dispersing the quantum dots in a solvent (e.g., organic solvent) to obtain a quantum dot dispersion and applying or depositing the quantum dot dispersion on the substrate or the charge auxiliary layer in an appropriate manner (e.g., spin coating, inkjet printing, etc.). The forming of the emission layer may further include heat-treating the applied or deposited quantum dot layer. The heat-treating temperature is not particularly limited, and may be appropriately selected taking into consideration a boiling point of the organic solvent. For example, the heat-treating temperature may be greater than or equal to about 60° C. The organic solvent of the quantum dot dispersion is not particularly limited and may be appropriately selected. In an embodiment, the organic solvent may include a (substituted or unsubstituted) aliphatic hydrocarbon organic solvent, a (substituted or unsubstituted) aromatic hydrocarbon organic solvent, an acetate solvent, or a combination thereof.

The electron auxiliary layer 14 may be formed by a wet process. The wet process may include a sol-gel process. In an embodiment, the wet process may include a dispersion obtained by dispersing nanoparticles of metal oxide in a polar solvent, applying the dispersion on the quantum dot emission layer for example by spin coating, and drying and annealing a resulting film. The polar solvent may include a C1 to C10 alcohol solvent such as methanol, or ethanol, a C2 to C20 sulfoxide solvent such as dimethyl sulfoxide, a C2 to C20 amide solvent such as dimethylformamide, or a combination thereof, but is not limited thereto.

The annealing may be carried out under vacuum at a predetermined temperature (e.g., greater than or equal to about 60° C., or greater than or equal to about 70° C. and less than or equal to about 100° C., for example, less than or equal to about 90° C., less than or equal to about 80° C., or less than or equal to about 75° C.), but is not limited thereto.

The light emitting device may exhibit improved properties and lifetime properties. The light emitting device may (for example, emit blue light, and) exhibit a maximum brightness of greater than or equal to about 35,000 cd/m$^2$, for example, greater than or equal to about 36,000 cd/m$^2$, or greater than or equal to about 37,000 cd/m$^2$. The light emitting device may have a T50 of greater than about 50 hours, for example, greater than or equal to about 55, greater than or equal to about 60 hours, greater than or equal to about 65 hours, or greater than or equal to about 70 hours while it may emit blue light.

The light emitting device may be used in a various electronic device. The electronic device may be applied to various electronic devices such as display devices or lighting devices.

In an embodiment, PL properties (for example, of the quantum dots or the metal oxide nanoparticles for a trap emission or a bandedge emission) may be readily and reproducibly determined using a commercially available spectrophotometer (for example from Hitach Co. Ltd or Hammamatsu Co. Ltd) at a desired temperature (e.g., room temperature or a low temperature such as 77k.

An irradiation wavelength may be from e.g., about 200 nm to about 400 nm or about 250 nm to about 390 nm or about 280 nm to about 380 nm or about 300 nm to about 375 nm). The sample preparation may be made according to a manual provided by a manufacturer (e.g., in a dispersion of an organic solvent such as a hydrocarbon solvent e.g., toluene, hexane, or the like)

In an embodiment, UV-Vis absorption properties may be readily determined using a commercially available spectrophotometer (e.g., Hitachi U series spectrophotometer or Agilent Cary series spectrophotometer)

Hereinafter, embodiments are illustrated in more detail with reference to examples. However, these examples are exemplary, and the present scope is not limited thereto.

Analysis Method

1. Photoluminescence Analysis

Photoluminescence (PL) spectra of the prepared nanocrystal or the prepared metal oxide nanoparticle are obtained using a Hitachi F-7000 spectrophotometer at an irradiation wavelength of 372 nanometers (nm) (for quantum dots) and 300 nm (for the metal oxide nanoparticle) for a solution (solvent: hexane).

2. Ultraviolet-Visible (UV-Vis) Spectroscopic Analysis

Hitachi U-3310 spectrophotometer is used to perform an ultraviolet (UV) spectroscopic analysis and obtain UV-Visible absorption spectra.

3. Transmission Electron Microscopy (TEM) Analysis

Transmission electron microscope photographs of nanocrystals are obtained using an UT F30 Tecnai electron microscope.

4. Transmission Line Measurement (TLM) Analysis

A TLM analysis is carried out by using a MacScience JVL equipment. On a surface of a thin film of a semiconductor to be measured for conductivity, a plurality of metal electrodes are formed at different positional intervals. Then, any two electrodes are selected and a voltage is applied therebetween to measure a current. By doing this, a resistance value depending on a distance between the metal electrodes are obtained and from such data, a resistivity and a conductivity can be determined.

5. Low temperature Photoluminescence Analysis

Photoluminescence (PL) spectra of the prepared nanocrystal or the metal oxide nanoparticle (in hexane) are obtained using a Hitachi F-7000 spectrophotometer at an irradiation wavelength of 300 nanometers (nm) at 77 K.

6. Electroluminescence Spectroscopy

The obtained light emitting device is evaluated for an electro-luminescence property using a Keithley 2200 source measurement equipment and a Minolta CS2000 spectroradiometer (current-voltage-luminance measurement equipment). The current, luminance, and electroluminescence (EL) depending upon a voltage applied to the device is measured by the current-voltage-luminance measurement equipment, and thereby an external quantum efficiency (EQE) can be determined.

7. Lifetime Analysis (1) T50 (hr): a time taken fora given device to exhibit a 50% reduction of the initial luminance (100%) is measured with the device operated at 100 nit.

(2) T95 (hr): a time taken for a given device to exhibit 95% of the initial luminance (100%) is measured with the device operated at 100 nit.

8. TGA Analysis

A thermogravimetric analysis is carried out using a TA instruments Q5000.

Synthesis of Quantum Dots

Reference Example 1: Preparation of Red Light Emitting Quantum Dots

Reference Example 1

(1) Selenium (Se) and tellurium (Te) are dispersed in trioctylphosphine (TOP) to obtain a 2 molar (M) Se/TOP stock solution and 0.1 M Te/TOP stock solution, respectively. 0.125 millimoles (mmol) of zinc acetate is added along with oleic acid and hexadecylamine to a reactor including trioctylamine and the resulting solution is heated under vacuum at 120° C. After one hour, an atmosphere of nitrogen is added to the reactor.

Subsequently, the reactor is heated up to 300° C., the prepared Se/TOP stock solution and Te/TOP stock solution are rapidly injected into the reactor in a Te:Se mole ratio of 1:25. After 60 minutes, acetone is added to the reaction solution, and the reaction mixture is rapidly cooled to room temperature. A precipitate obtained after centrifugation is dispersed in toluene to obtain a ZnTeSe core.

(2) 1.8 millimoles (mmol) (0.336 g) of zinc acetate is added along with oleic acid to a reaction flask including trioctylamine and then vacuum-treated at 120° C. for 10 minutes. Nitrogen is then introduced into the reaction flask, and the temperature is increased up to 180° C. The ZnTeSe core obtained above is added to the reaction flask, Se/TOP stock solution is added and then a temperature is increased up to 280° C. Then, 1M of S/TOP stock solution is added, the temperature is increased to 320° C., the Se/TOP stock solution and S/TOP stock solution are then added to the reaction flask in predetermined amounts. After the reaction is complete, the reactor is cooled, ethanol is added, and the mixture is centrifuged. The recovered nanocrystal is dispersed in toluene to obtain a toluene dispersion of ZnTeSe/ZnSeS core/shell quantum dots.

The used amounts of the S precursor and the Se precursor are about 0.25 moles and 0.6 moles pre one mole of the zinc precursor, respectively.

Reference Example 2

The quantum dots prepared in Reference Example 1 are dispersed in 5 mL of octane at a concentration of 20 milligrams per milliliter (mg/mL) to obtain quantum dot organic dispersion. Zinc chloride is dissolved in ethanol to obtain a zinc chloride solution having a concentration of 10 weight percent (wt %). 0.01 milliliters (mL) of the obtained zinc chloride solution is added to the prepared quantum dot organic dispersion and then, stirred at 60° C. for 30 minutes to perform a surface exchange reaction. After the reaction, ethanol is added thereto to induce a precipitation, and the quantum dots are recovered through centrifugation.

Synthesis of Metal Oxide Nanoparticles

Comparative Preparation Example 1: Synthesis of ZnMgO

Zinc acetate dihydrate and magnesium acetate tetrahydrate are added into a reactor including dimethyl sulfoxide and heated at 60° C. under air. Subsequently, an ethanol solution of tetramethyl ammonium hydroxide pentahydrate is added in a stoichiometric amount in a dropwise into the reactor. After stirring the same for 1 hour, the obtained precipitate including $Zn_{1-x}Mg_xO$ (x=0.15) nanoparticles are centrifuged and dispersed in ethanol to obtain $Zn_{1-x}Mg_xO$ nanoparticles.

A transmission electron microscopic analysis is performed for the obtained nanoparticles, and the results show that the particles have an average size of about 3 nm.

A thermogravimetric analysis is carried out for the obtained nanoparticles and the results confirm that in the nanoparticles, a residue content (an amount of organics) is about 72.6 wt %.

Preparation Comparative Example 2: Synthesis of ZnO

ZnO particles are synthesized in the same manner as set forth in Preparation Comparative Example 1 except for not using the magnesium acetate tetrahydrate.

A transmission electron microscopic analysis is performed for the obtained nanoparticles, and the results show that the particles have an average size of about 3.7 nm.

A thermogravimetric analysis is carried out for the obtained nanoparticles and the results confirm that in the nanoparticles, a residue content (an amount of organics) is about 84.7 wt %.

Preparation Example 1: Preparation of $Zn_{1-x}Mg_xO$/ZnO

Nanoparticles are prepared wherein a dopant distribution is predominant in the inner portion of a particle.

$Zn_{1-x}Mg_xO$ particles (x=0.15) (average size: 3 nm) are prepared in a similar manner set forth in Preparation Comparative Example 1. The $Zn_{1-x}Mg_xO$ particles are dispersed in a reactor including a DMSO solvent. A second solution prepared by dissolving the zinc acetate dihydrate in a DMSO solvent having a concentration of 0.1 M is added to the reactor and a reaction is conducted for 60 minutes to obtain nanoparticles having a structure of $Zn_{1-x}Mg_xO$/ZnO wherein the magnesium dopant is predominantly distributed in the inner portion of the particle.

A TEM analysis is carried out for the obtained nanoparticles and the results show that the average size of the particles is about 3.3 nm.

A thermogravimetric analysis is carried out for the obtained nanoparticles and the results confirm that in the nanoparticles, a residue content (an amount of organics) is about 74.1 wt %.

Preparation Example 2: Preparation of $ZnO/Zn_{1-x}Mg_xO$

Nanoparticles are prepared wherein a dopant distribution is predominant in the outer portion of a particle.

ZnO particles (average size: 3.7 nm) are prepared in a similar manner set forth in Preparation Comparative Example 2.

The ZnO particles are dispersed in a reactor including a DMSO solvent. A second solution prepared by dissolving the zinc acetate dihydrate and magnesium acetate tetrahydrate in a DMSO solvent (zinc concentration: 0.1M) is added to the reactor and a reaction is conducted for 60 minutes to obtain nanoparticles having a structure of $ZnO/Zn_{1-x}Mg_xO$ (x=0.15) wherein the magnesium dopant is predominantly distributed in the outer portion or layer (i.e., on a surface) of the particle.

A TEM analysis is carried out for the obtained nanoparticles and the results show that the average size of the particles is about 4.1 nm.

A thermogravimetric analysis is carried out for the obtained nanoparticles and the results confirm that in the nanoparticles, a residue content (an amount of organics) is about 80.8 wt %

Experimental Example 1: Evaluation of Electrical Properties of the Metal Oxide Nanoparticles For the nanoparticles prepared in Preparation Comparative Example 1, Preparation Comparative Example 2, and Preparation Example 1, resistivity and contact resistance are measured by using a TLM method and the results are summarized in Table 1.

TABLE 1

|  | Resistivity (unit: ohm · cm) | Contact resistance (unit: ohm · cm$^2$) |
| --- | --- | --- |
| Preparation Comparative Example 1 (ZnMgO) | 3 × 10$^8$ | 1.4 × 10$^{11}$ |
| Preparation Comparative Example 2 (ZnO) | 3 × 10$^8$ | 1 × 10$^{11}$ |
| Preparation Example 1 (ZnMgO/ZnO) | 4 × 10$^8$ | 1 × 10$^{11}$ |

The results of table 1 confirm that the nanoparticles of Preparation Example 1 show a low level of contact resistance comparable that of the nanoparticles prepared in Preparation Comparative Example 2.

Evaluation of Optical Properties of the Metal Oxide Nanoparticles

Figure 3:
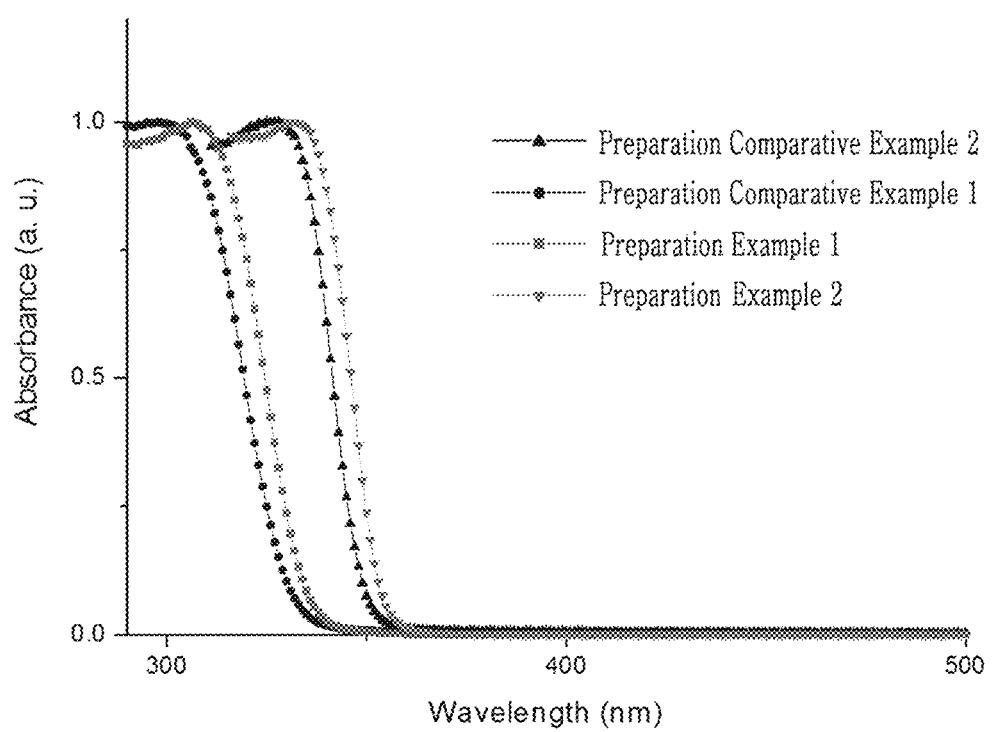
FIG. 3 is a graph of absorbance (arbitrary units (a. u.)) versus wavelength (nm) showing ultraviolet-visible (UV-Vis) spectrums of the metal oxide nanoparticles prepared in Comparative Preparation Examples 1 and 2 and Preparation Examples 1 and 2, FIG. 4A s is a graph of PL intensity (a. u.) versus wavelength (nm) showing a room temperature photoluminescent spectrum of the metal oxide nanoparticles prepared in Comparative Preparation Examples 1 and 2 and Preparation Examples 1 and 2.
Figure 4A:
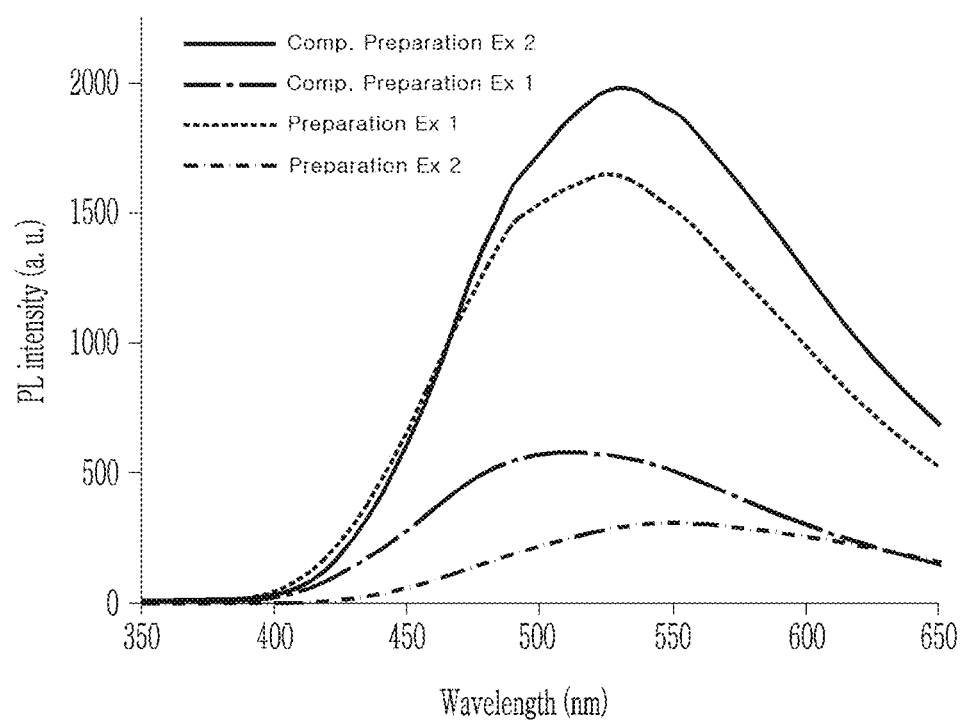
FIG. 4B is a graph of PL intensity (a. u.) versus wavelength (nm) showing a low temperature photoluminescent spectrum of the metal oxide nanoparticles prepared in Comparative Preparation Example 1 and Preparation Example 1.

Experimental Example 2-1:

For the prepared metal oxide nanoparticles, a UV-Vis absorption spectroscopy analysis and a photoluminescent spectroscopy analysis are carried out and the results are shown in FIG. 3 and FIG. 4A.

In FIG. 3 and FIG. 4A, a luminescent peak appearing in a wavelength region greater than 500 nm is a peak of a trap emission. The results of FIG. 3 and FIG. 4A confirm that when the magnesium dopant is distributed over substantially the entire portion of the particle or predominantly in the outer portion of the particle, the trap emission of the zinc oxide nanoparticles may decrease significantly and when the distribution of the magnesium dopant is limited predominantly in the inner portion of the particle, the trap emission may be maintained at a similar level to the particle without the metal dopant.

Figure 4B:
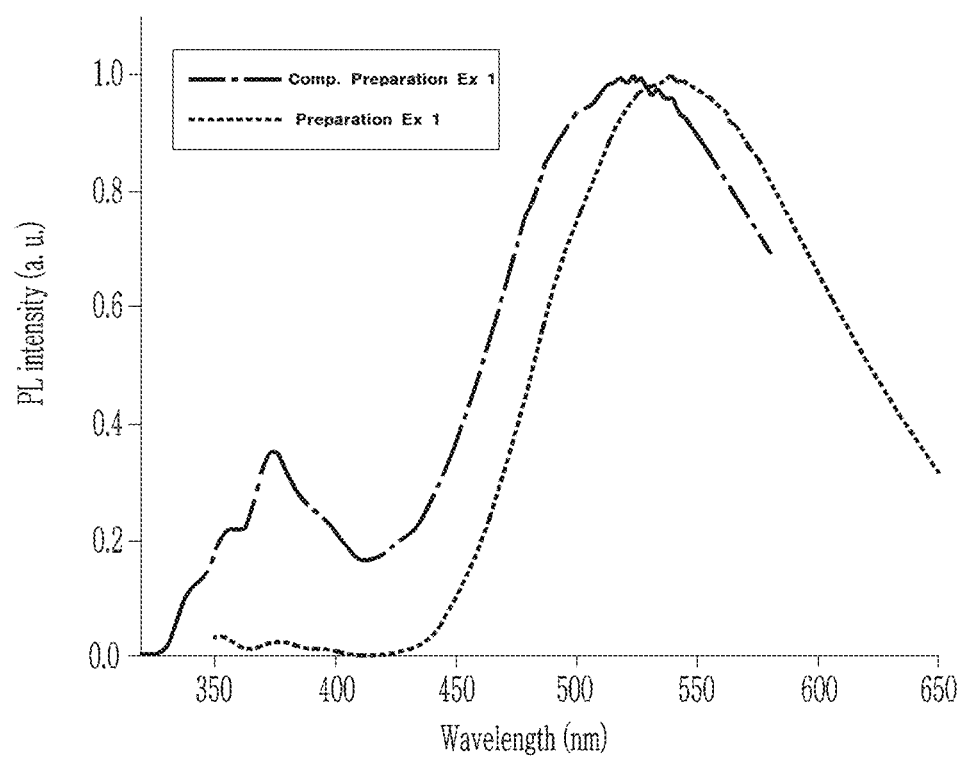

Experimental Example 2-2:

For the metal oxide nanoparticles prepared in Preparation Comparative Example 1 and Preparation Example 1, a low temperature photoluminescent spectroscopy analysis is carried out and the results are shown in FIG. 4B.

The results of FIG. 4B confirm that the nanoparticles of Preparation Example 1 may exhibit significantly increased ratio of the trap emission in comparison with those of Preparation Comparative Example 1.

Example 1

A device is prepared in the following manner:

Indium tin oxide (ITO)-deposited glass substrate is treated for the surface with UV-ozone for 15 minutes and then spin-coated with a poly(3,4-ethylenedioxythiophene) polystyrene sulfonate (PEDOT:PSS) solution (H. C. Starks) and heated at 150° C. for 10 minutes under air atmosphere, and then it is heat-treated again at 150° C. for a period between 20 minutes and 30 minutes under $N_2$ atmosphere to provide a hole injection layer having a thickness of 30 nm. Subsequently, poly[(9,9-dioctylfluorenyl-2,7-diyl-co(4,4'-(N-4-butylphenyl)diphenylamine] solution (TFB) (Sumitomo) is spin-coated on the hole injection layer and heated at 150° C. for 30 minutes to provide a hole transport layer having a thickness of 25 nm.

A quantum dot dispersion obtained from Reference Example 1 is spin-coated on the hole transport layer as obtained above, and a zinc chloride ethanol solution is dropped thereon and spin-dried, then the resulting structure is heat-treated at 80° C. for 30 minutes. Then, a quantum dot dispersion obtained from Reference Example 2 is spin-coated thereon to provide an emissive layer having a thickness of 20 nm.

An ethanol dispersion including the nanoparticles obtained from Preparation Example 1 is prepared. The obtained solution is spin-coated on the emission layer and heated at 80° C. for 30 minutes to provide an electron auxiliary layer having a thickness of 20 nm.

100 nm of aluminum (Al) is vacuum-deposited on the obtained electron auxiliary layer to provide a second electrode, so as to obtain a light emitting device.

Figure 5:
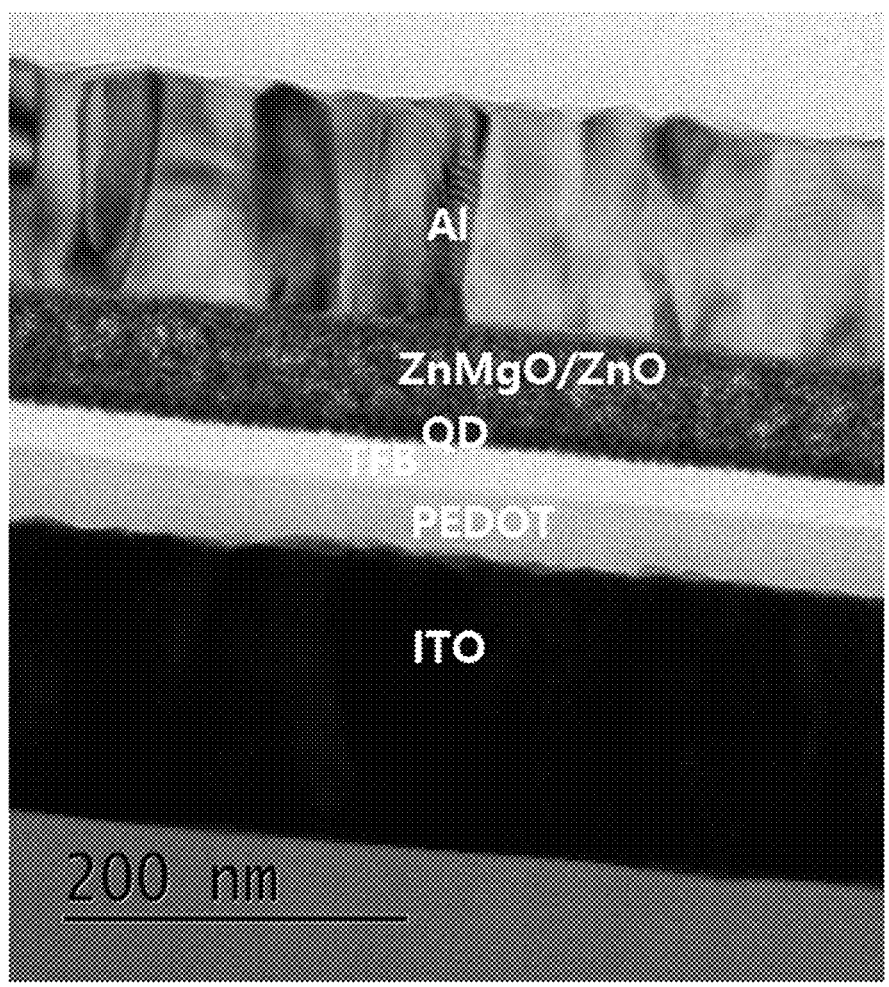
FIG. 5 is an electron microscopy image of a cross-section of a device prepared in Example 1.

A FIB (Focused ion beam) is used to prepare a device cross-section sample for the prepared device, which is then subjected to a TEM analysis. The results are shown in FIG. 5.

(2) The obtained quantum dot light emitting device is evaluated for electro-luminescent properties. The results are shown in Table 2.

Comparative Example 1

A light emitting device is obtained in accordance with the same procedure as in Example 1, except that the electron auxiliary layer is formed using the nanoparticles of Comparative Preparation Example 1 instead of those of Preparation Example 1. The obtained light emitting device is evaluated for electro-luminescence properties and the results are shown in Table 2.

Comparative Example 2

A light emitting device is obtained in accordance with the same procedure as in Example 1, except that the electron auxiliary layer is formed using the nanoparticles of Comparative Preparation Example 2 instead of those of Preparation Example 1. The obtained light emitting device is evaluated for electro-luminescence properties and the results are shown in Table 2.

TABLE 2

| | The composition of the nanoparticle in the electron auxiliary layer | Max. Brightness (candelas per square meter) (cd/m²) | EQE @ 5,000 nit (%) | T95 (hours) | T50 (hours) |
|---|---|---|---|---|---|
| Example 1 | ZnMgO/ZnO | 38,960 | 10.5 | 14.26 | 71.9 |
| Comp. Example 1 | ZnMgO | 36,530 | 9.0 | 8.37 | 59.3 |
| Comp. Example 2 | ZnO | 30,160 | 5.7 | 8.05 | 38.8 |

* EQE @ 5,000 nit: external quantum efficiency at luminance of 5,000 nit (candelas per square meter)
* Max. brightness: maximum brightness From the results of Table 1, it is confirmed that the device according to Example 1 may exhibit improved electroluminescent properties and the lifetime of the device of Example 1 is significantly increased.

While this disclosure has been described in connection with what is presently considered to be practical example embodiments, it is to be understood that the invention is not limited to the disclosed embodiments, but, on the contrary, is intended to cover various modifications and equivalent arrangements included within the spirit and scope of the appended claims.

What is claimed is:

1. A light emitting device, comprising
an emission layer comprising a plurality of quantum dots, and
an electron auxiliary layer disposed on the emission layer, the electron auxiliary layer to transport or inject electrons to the emission layer,
wherein the electron auxiliary layer comprises a plurality of metal oxide nanoparticles comprising a first metal oxide nanoparticle,
wherein the first metal oxide nanoparticle includes zinc and a dopant metal, wherein the dopant metal comprises Mg, and further comprises Mn, Ni, Sn, Al, Y, Ga, Zr, Li, Co, or a combination thereof,
wherein the dopant metal is included in the metal oxide nanoparticle to have a concentration gradient of the dopant metal in the first metal oxide nanoparticle, and
wherein a concentration of the dopant metal is different in core and shell portions of the first metal oxide nanoparticle.

2. The light emitting device of claim 1, wherein the quantum dots do not comprise cadmium, lead, or a combination thereof.

3. The light emitting device of claim 1, wherein the plurality of quantum dot comprises a Group II-VI compound, a Group III-V compound, a Group IV-VI compound, a Group IV element or compound, a Group compound, a Group compound, a Group I-II-IV-VI compound, or a combination thereof.

4. The light emitting device of claim 1, wherein the dopant metal comprises magnesium, and further comprises aluminum, lithium, gallium, or a combination thereof.

5. The light emitting device of claim 1, wherein a mole ratio of the magnesium with respect to the zinc in the metal oxide nanoparticles is greater than or equal to about 0.01:1 and less than or equal to about 0.5:1.

6. The light emitting device of claim 1, wherein the metal oxide nanoparticles have a band-edge emission peak having a center wavelength of about less than or equal to about 400 nanometers in a photoluminescent spectrum at 77 K.

7. The light emitting device of claim 1, wherein in a photoluminescent spectrum at 77 K of the metal oxide nanoparticles, a maximum intensity ratio of a trap emission peak with respect to a band-edge emission peak is greater than or equal to about 2.9:1.

8. The light emitting device of claim 1, wherein the metal oxide nanoparticles have a first ultraviolet absorption peak wavelength of less than or equal to about 350 nanometers.

9. The light emitting device of claim 1, wherein the metal oxide nanoparticles have an organic content of greater than or equal to about 20 weight percent as determined by a thermogravimetric analysis.

10. The light emitting device of claim 1, wherein the electron auxiliary layer has a contact resistance of less than or equal to about $5\times10^{11}$ ohm·cm$^2$, a resistivity of greater than or equal to about $1\times10^4$ ohm cm, or a combination thereof.

11. The light emitting device of claim 1, wherein an average size of the metal oxide nanoparticles is greater than or equal to about 2 nanometer and less than or equal to about 10 nanometers.

12. The light emitting device of claim 1, wherein the light emitting device emits blue light and has a maximum external quantum efficiency of greater than or equal to about 10%.

13. The light emitting device of claim 1, wherein the light emitting device emits blue light and has maximum brightness of greater than or equal to about 35,000 candelas per square meter.

14. The light emitting device of claim 1, wherein the light emitting device emits blue light and has a T50 of greater than about 50 hours.

15. A display device comprising the light emitting device of claim 1.

16. The light emitting device of claim 1, wherein a concentration of the magnesium is different in the core and shell portions of the first metal oxide nanoparticle.

17. The light emitting device of claim 1, wherein a concentration of the Mn, Ni, Sn, Al, Y, Ga, Zr, Li, Co, or a combination thereof is different in the core and shell portions of the first metal oxide nanoparticle.

18. A light emitting device, comprising
an emission layer comprising a plurality of quantum dots, and
an electron auxiliary layer disposed on the emission layer, the electron auxiliary layer to transport or inject electrons to the emission layer,
wherein the electron auxiliary layer comprises a plurality of metal oxide nanoparticles,
wherein the metal oxide nanoparticles have a trap emission peak having a center wavelength of greater than or equal to about 500 nanometers and less than or equal to about 600 nanometers,
wherein the metal oxide nanoparticles have a core shell structure comprising a core comprising a first metal oxide and a shell disposed on the core, the shell comprising a second metal oxide,
wherein the second metal oxide has a different composition from a composition of the first metal oxide,
wherein the first metal oxide comprises a zinc oxide,
wherein the second metal oxide comprises a compound represented by Chemical Formula 2:

$$Zn_{1-y}M_yO \qquad \text{Chemical Formula 2}$$

wherein, M is Mg, Al, Y, Li, Ga, Zr, Ni, Co, or a combination thereof and 0<y<1, and
wherein the shell comprises an outermost layer of the metal oxide nanoparticle.

19. A light emitting device, comprising
an emission layer comprising a plurality of quantum dots, and
an electron auxiliary layer disposed on the emission layer, the electron auxiliary layer to transport or inject electrons to the emission layer,
wherein the electron auxiliary layer comprises a plurality of metal oxide nanoparticles,
wherein the metal oxide nanoparticles include zinc and a dopant metal, wherein the dopant metal comprises Mg, Mn, Ni, Sn, Al, Y, Ga, Zr, Li, Co, or a combination thereof,
wherein the metal oxide nanoparticles have a core shell structure comprising a core comprising a first metal oxide and a shell disposed on the core, the shell comprising a second metal oxide,
wherein the second metal oxide has a different composition from a composition of the first metal oxide,
wherein the first metal oxide comprises zinc and a first metal,
wherein the second metal oxide comprises zinc and optionally a second metal,
wherein the first metal comprises magnesium, aluminum, lithium, yttrium, gallium, zirconium, nickel, cobalt, or a combination thereof,
wherein the second metal comprises aluminum, lithium, yttrium, gallium, zirconium, nickel, cobalt, or a combination thereof,
wherein a bandgap energy of the first metal oxide is greater than or equal to a bandgap energy of the second metal oxide, and
wherein a mole ratio of the first metal with respect to zinc in the metal oxide nanoparticles is less than about 1:1.

20. The light emitting device of claim 19, wherein the first metal comprises magnesium.

21. The light emitting device of claim 19, wherein the second metal oxide comprises a compound represented by Chemical Formula 2:

$$Zn_{1-y}M_yO \qquad \text{Chemical Formula 2}$$

wherein, M is Mg, Al, Y, Li, Ga, Zr, Ni, Co, or a combination thereof and 0≤y<1.

22. The light emitting device of claim 19, wherein the first metal oxide comprises zinc magnesium oxide and the second metal oxide comprises zinc oxide.

23. A light emitting device, comprising
an emission layer comprising a plurality of quantum dots, and
an electron auxiliary layer disposed on the emission layer, the electron auxiliary layer to transport or inject electrons to the emission layer,
wherein the electron auxiliary layer comprises a plurality of metal oxide nanoparticles,
wherein the metal oxide nanoparticles include zinc and a dopant metal, wherein the dopant metal comprises Mg, Mn, Ni, Sn, Al, Y, Ga, Zr, Li, Co, or a combination thereof,
wherein the metal oxide nanoparticles have a core shell structure comprising a core comprising a first metal oxide and a shell disposed on the core, the shell comprising a second metal oxide,
wherein the second metal oxide has a different composition from a composition of the first metal oxide,
wherein the first metal oxide comprises a zinc oxide,
wherein the second metal oxide comprises a compound represented by Chemical Formula 2:

$$Zn_{1-y}M_yO \qquad \text{Chemical Formula 2}$$

wherein, M is Mg, Al, Y, Li, Ga, Zr, Ni, Co, or a combination thereof and $0<y<1$, and wherein the shell comprises an outermost layer of the metal oxide nanoparticle.

24. The light emitting device of claim 23, wherein the first metal oxide essentially consists of ZnO.

* * * * *